United States Patent
Jeon et al.

(10) Patent No.: US 12,456,631 B2
(45) Date of Patent: Oct. 28, 2025

(54) METHOD OF MANUFACTURING SEMICONDUCTOR DEVICE

(71) Applicant: Samsung Electronics Co., Ltd., Suwon-si (KR)

(72) Inventors: Hyungjun Jeon, Seoul (KR); Taeyeong Kim, Yongin-si (KR); Hoechul Kim, Seoul (KR); Junhong Min, Ulsan (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 207 days.

(21) Appl. No.: 18/337,202

(22) Filed: Jun. 19, 2023

(65) Prior Publication Data

US 2023/0335415 A1  Oct. 19, 2023

Related U.S. Application Data

(63) Continuation of application No. 17/014,335, filed on Sep. 8, 2020, now Pat. No. 11,721,562.

(30) Foreign Application Priority Data

Nov. 7, 2019  (KR) .................. 10-2019-0141901

(51) Int. Cl.
  B32B 41/00  (2006.01)
  B32B 37/00  (2006.01)
  (Continued)

(52) U.S. Cl.
  CPC ...... H01L 21/67017 (2013.01); B32B 37/003 (2013.01); B32B 37/0046 (2013.01);
  (Continued)

(58) Field of Classification Search
  CPC ......... H01L 21/67017; H01L 21/67092; H01L 24/74; H01L 21/6838; H01L 21/68742;
  (Continued)

(56) References Cited

U.S. PATENT DOCUMENTS 5,939,831 A  *  8/1999  Fong ............... H01L 21/67017
                                                            134/1.1
7,275,577 B2  10/2007  Lee et al.
(Continued)

FOREIGN PATENT DOCUMENTS

JP     2015-142117 A      8/2015
KR   10-2018-0114896 A   10/2018
KR   10-2019-0116937 B1   8/2021

OTHER PUBLICATIONS

Office Action issued Jun. 14, 2024 by the Korean Intellectual Property Office for corresponding KR Patent Application No. 10-2019-0141901.

*Primary Examiner* — Michael N Orlando
*Assistant Examiner* — Joshel Rivera
(74) *Attorney, Agent, or Firm* — Muir Patent Law, PLLC

(57) ABSTRACT

A bonding method for bonding a first substrate to a second substrate includes fixing the first substrate to a first surface of a first bonding chuck and fixing the second substrate to a second surface of a second bonding chuck, the second surface facing the first surface; aligning the second bonding chuck above the first bonding chuck in a vertical direction or in a horizontal direction; bonding the first substrate to the second substrate to make a bonded substrate; and wherein, in the bonding the first substrate to the second substrate, injecting a process gas between the first substrate and the second substrate using a process gas injector surrounding at least one selected from the first bonding chuck and the second bonding chuck in a plan view and injecting an air curtain forming gas to form an air curtain surrounding the first substrate and the second substrate using an air curtain generator are performed in combination.

20 Claims, 20 Drawing Sheets

(51) Int. Cl.
*H01L 21/67* (2006.01)
*H01L 23/00* (2006.01)
*H01L 21/683* (2006.01)
*H01L 21/687* (2006.01)
*H01L 25/00* (2006.01)
*H10F 39/00* (2025.01)

(52) U.S. Cl.
CPC ........ *B32B 41/00* (2013.01); *H01L 21/67092* (2013.01); *H01L 24/74* (2013.01); *B32B 2309/02* (2013.01); *B32B 2309/12* (2013.01); *B32B 2309/60* (2013.01); *B32B 2457/14* (2013.01); *H01L 21/6838* (2013.01); *H01L 21/68742* (2013.01); *H01L 25/50* (2013.01); *H10F 39/018* (2025.01)

(58) Field of Classification Search
CPC ........ H01L 25/50; H01L 24/80; H01L 24/94; H01L 2224/05647; H01L 2224/0603; H01L 2224/08058; H01L 2224/08121; H01L 2224/08145; H01L 2224/09051; H01L 2224/751; H01L 2224/75314; H01L 2224/75318; H01L 2224/80097; H01L 2224/80895; H01L 2224/80896; H01L 2224/80948; H01L 2224/94; H01L 21/68735; H01L 21/187; H01L 21/67276; H01L 21/68; B32B 37/003; B32B 37/0046; B32B 41/00; B32B 2309/02; B32B 2309/12; B32B 2309/60; B32B 2457/14; H10F 39/018
USPC .................... 156/60, 64, 350, 351, 378, 379
See application file for complete search history.

(56) References Cited

U.S. PATENT DOCUMENTS

| | | |
|---|---|---|
| 8,245,751 B2 | 8/2012 | Hwang |
| 8,999,090 B2 | 4/2015 | Gaudin et al. |
| 9,004,135 B2 | 4/2015 | Castex et al. |
| 9,048,283 B2 | 6/2015 | Liu et al. |
| 9,922,851 B2 | 3/2018 | Lin et al. |
| 10,755,929 B2 | 8/2020 | Wagenleitner et al. |
| 10,847,495 B2 | 11/2020 | Nagata et al. |
| 2004/0095546 A1* | 5/2004 | Lee ............... B32B 38/1833 349/187 |
| 2017/0207089 A1 | 7/2017 | Lin et al. |
| 2017/0207191 A1 | 7/2017 | Huang et al. |
| 2018/0047699 A1 | 2/2018 | Omori et al. |
| 2018/0144999 A1 | 5/2018 | Lu et al. |
| 2019/0096848 A1 | 3/2019 | Huang et al. |

* cited by examiner

V - V'

METHOD OF MANUFACTURING SEMICONDUCTOR DEVICE

CROSS-REFERENCE TO RELATED APPLICATION

This application claims priority under 35 U.S.C. § 119 to Korean Patent Application No. 10-2019-0141901, filed on Nov. 7, 2019, in the Korean Intellectual Property Office, the disclosure of which is incorporated herein in its entirety by reference.

BACKGROUND

The inventive concept relates to a substrate bonding apparatus and method.

During the manufacture of semiconductor devices, a process of bonding at least two substrates to each other may be performed. The substrate bonding process may be performed to increase the mounting density of semiconductor chips in a semiconductor apparatus. For example, semiconductor modules including stacked semiconductor chips may be favorable to increase the mounting density of semiconductor chips, to reduce the length of wiring between semiconductor chips, and to increase a signal processing speed. In the case of manufacturing a semiconductor module having a stack structure of semiconductor chips, productivity may increase when wafers are bonded to each other and then cut into stacked semiconductor chip units compared to when semiconductor chips are bonded to each other. A substrate bonding process may be performed using a wafer-to-wafer method by which two wafers are directly bonded to each other without a medium therebetween. The wafer-to-wafer method may be usually performed using a bonding apparatus, which includes a bonding chuck supporting wafers and an element pressing the wafers.

SUMMARY

Aspects of the inventive concept provide a substrate bonding apparatus and method for preventing a void from occurring due to vapor during a substrate bonding process and for increasing the yield of the substrate bonding process.

According to an aspect of the inventive concept, there is provided a substrate bonding apparatus for bonding a first substrate to a second substrate. The substrate bonding apparatus includes a first bonding chuck configured to fix the first substrate to a first surface of the first bonding chuck; a second bonding chuck configured to fix the second substrate to a second surface of the second bonding chuck, the second surface facing the first surface; a process gas injector surrounding at least one selected from the first bonding chuck and the second bonding chuck in a plan view, the process gas injector configured to inject a process gas between the first substrate and the second substrate when respectively disposed on the first bonding chuck and the second bonding chuck; and an air curtain generator disposed at an outside of the process gas injector in the plan view, the air curtain generator configured to inject an air curtain forming gas to form an air curtain surrounding the first substrate and the second substrate.

According to another aspect of the inventive concept, there is provided a substrate bonding apparatus for bonding a first substrate to a second substrate. The substrate bonding apparatus includes a first bonding chuck configured to fix the first substrate to a first surface of the first bonding chuck; a second bonding chuck configured to fix the second substrate to a second surface of the second bonding chuck, the second surface facing the first surface; and a process gas injector surrounding at least one selected from the first bonding chuck and the second bonding chuck in a plan view and configured to inject a process gas between the first substrate and the second substrate in a first direction, wherein the first direction is a direction from an edge portion of the first substrate toward a central portion of the first substrate.

According to a further aspect of the inventive concept, there is provided a substrate bonding apparatus for bonding a first substrate to a second substrate. The substrate bonding apparatus includes a first bonding chuck configured to fix the first substrate to a first surface of the first bonding chuck; a second bonding chuck configured to fix the second substrate to a second surface of the second bonding chuck, the second surface facing the first surface; and an air curtain generator disposed at an outside of the first and second bonding chucks in a plan view and configured to inject an air curtain forming gas to form an air curtain surrounding edges of the first and second substrates respectively fixed on the first and second surfaces of the first and second bonding chucks.

According to example embodiments, during bonding between a first substrate and a second substrate, a process gas may be supplied between the first and second substrates, and an air curtain forming gas may form an air curtain surrounding the first and second substrates. Accordingly, during the bonding between the first and second substrates, a pressure may be prevented from rapidly dropping near the outer regions of the first and second substrates, and occurrence of a void may be suppressed because vapor is not condensed between the first and second substrates.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
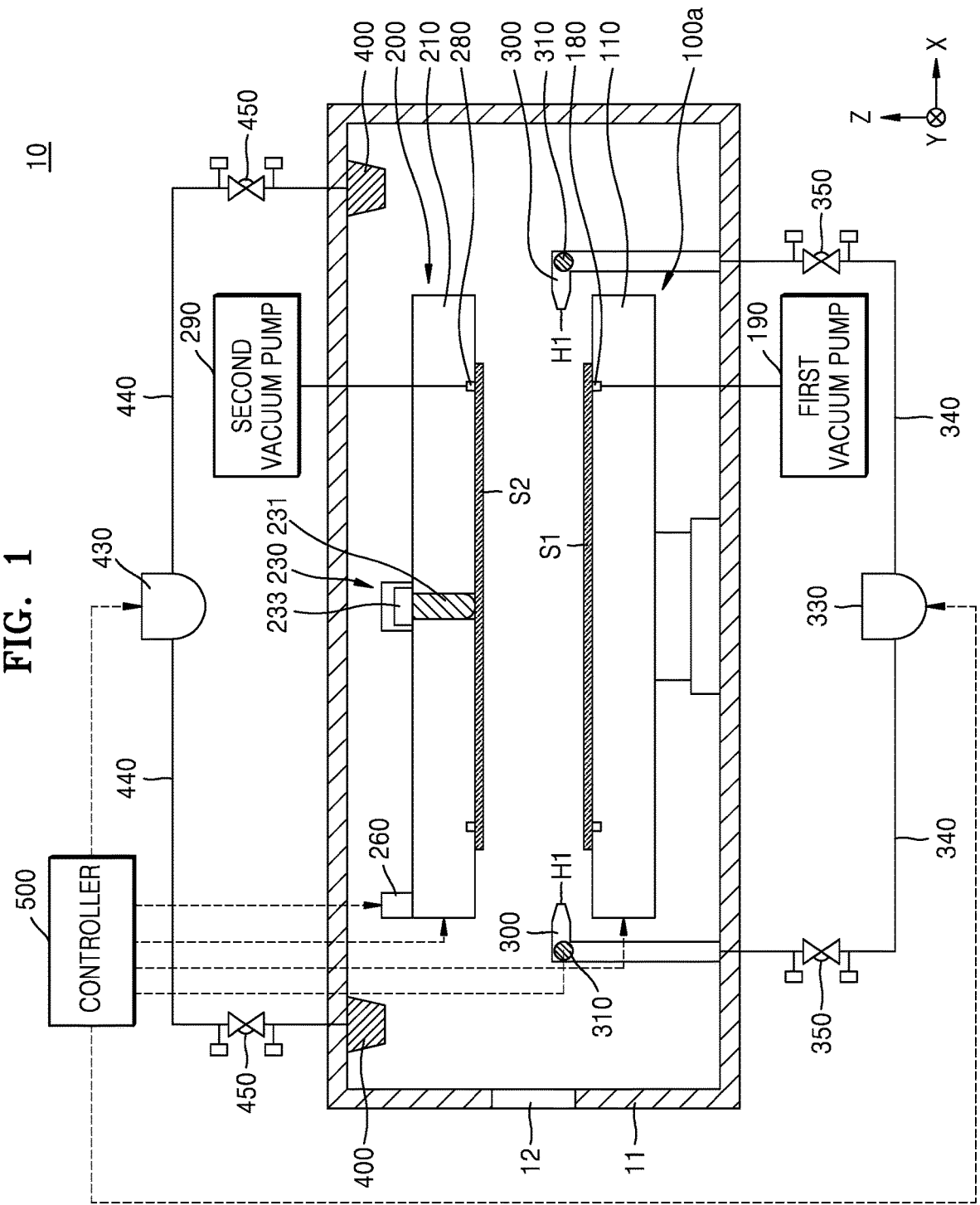
FIG. 1 is a cross-sectional view of a first substrate bonding apparatus according to an example embodiment.

Hereinafter, embodiments will be described in detail with reference to the accompanying drawings. In the drawing, like reference characters denote like elements, and redundant descriptions thereof will be omitted.

FIG. 1 is a cross-sectional view of a first substrate bonding apparatus 10 according to an example embodiment.

Referring to FIG. 1, the first substrate bonding apparatus 10 may include a chamber 11, a first bonding chuck 100a, a second bonding chuck 200, a process gas injector 300, an air curtain generator 400, and a controller 500.

The chamber 11 may surround the first bonding chuck 100a and the second bonding chuck 200. The chamber 11 may provide an inner space for a substrate bonding process performed on a first substrate S1 and a second substrate S2. In an example embodiment, vacuum pressure or atmospheric pressure may be formed in the inner space of the chamber 11.

The chamber 11 may include an opening 12. The first substrate S1 and the second substrate S2 may be carried into or out of the inner space of the chamber 11 through the opening 12 of the chamber 11. The opening 12 may be airtightly sealed up when necessary to protect the inner space of the chamber 11 from an external environment.

The first bonding chuck 100a may be configured to support the first substrate S1. For example, the first substrate S1 may include a monocrystalline substrate or a silicon wafer.

The first bonding chuck 100a may be configured to fix the first substrate S1 using, for example, vacuum pressure. When the first bonding chuck 100a is configured to fix the first substrate S1 using vacuum pressure, the first bonding chuck 100a may be configured to apply a lower pressure than an ambient pressure to a surface of the first substrate S1, which faces a surface of a first base 110.

The first bonding chuck 100a may be configured to fix the first substrate S1 using an electrostatic force. When the first bonding chuck 100a is configured to fix the first substrate S1 using an electrostatic force, the first bonding chuck 100a may include an electrode, which receives electric power and generates an electrostatic force for fixing the first substrate S1 on the first bonding chuck 100a.

In an example embodiment, the first bonding chuck 100a may include the first base 110, on which the first substrate S1 is seated, and a first vacuum pump 190 configured to apply vacuum pressure to a first vacuum recess 180 provided in the first base 110. The first vacuum pump 190 may apply vacuum pressure to the first vacuum recess 180 such that the first substrate S1 is vacuum-adsorbed (e.g., adheres) to the surface of the first base 110 by a suction pressure and may release the suction pressure/vacuum pressure of the first vacuum recess 180 such that the vacuum-adsorption (e.g., suction pressure) of the first substrate S1 is released. For example, the first substrate S1 may be fixed on or released from the surface of the first base 110 by a strength of a suction force applied by the first vacuum pump 190.

The first vacuum recess 180 may be formed in a region, in which at least an outer region of the first substrate S1 is seated, so that the outer region of the first substrate S1 is fixed to the first bonding chuck 100a. However, embodiments are not limited thereto, and a plurality of first vacuum recesses 180 may be formed between the center and the outer circumference of the first base 110. For example, a plurality of vacuum recesses may be arranged in concentric circles in the first base 110, and the first vacuum pump 190 may be configured to independently control the pressure of the vacuum recesses formed in the first base 110. For example, the first vacuum pump 190 may apply different vacuum forces to the respective vacuum recesses 180 to fix and/or release the first substrate S1 on/from the surface of the first base 110 partially.

The second bonding chuck 200 may be arranged to face the first bonding chuck 100a. The second bonding chuck 200 may support the second substrate S2 such that a second bonding surface of the second substrate S2 faces a first bonding surface of the first substrate S1. For example, the second substrate S2 may include a monocrystalline substrate or a silicon wafer.

The second bonding chuck 200 may be configured to fix the second substrate S2 using, for example, vacuum pressure. When the second bonding chuck 200 is configured to fix the second substrate S2 using vacuum pressure, the second bonding chuck 200 may be configured to apply a lower pressure than an ambient pressure to a surface of the second substrate S2, which faces a surface of a second base 210.

When the second bonding chuck 200 is configured to fix the second substrate S2 using an electrostatic force, the second bonding chuck 200 may include an electrode, which receives electric power and generates an electrostatic force for fixing the second substrate S2 on the second bonding chuck 200.

At this time, the first bonding chuck 100a may correspond to a lower bonding chuck, and the second bonding chuck 200 may correspond to an upper bonding chuck located above the first bonding chuck 100a. However, embodiments are not limited thereto, and the second bonding chuck 200 may correspond to a lower bonding chuck, and the first bonding chuck 100a may correspond to an upper bonding chuck located above the second bonding chuck 200.

In an example embodiment, the second bonding chuck 200 may include the second base 210, on which the second substrate S2 is seated, and a second vacuum pump 290 configured to apply vacuum pressure to a second vacuum recess 280 provided in the second base 210. The second vacuum pump 290 may apply vacuum pressure to the second vacuum recess 280 such that the second substrate S2 is vacuum-adsorbed (e.g., adheres) to the surface of the second base 210 by a suction pressure and may release the suction pressure/vacuum pressure of the second vacuum recess 280 such that the vacuum-adsorption (e.g., adhering) of the second substrate S2 is released. For example, the second substrate S2 may be fixed on or released from the surface of the second base 210 by a strength of a suction force applied by the second vacuum pump 290.

In an example embodiment, the second bonding chuck 200 may further include a pressure device 230 to press the second substrate S2. The pressure device 230 may include a pressing pin 231, which is configured to perform a reciprocating motion in a direction (e.g., a Z direction) substantially perpendicular to the second bonding surface of the second substrate S2, e.g., when the second substrate S2 is fixed on the surface of the second base 210, and a pin actuator 233 driving the pressing pin 231. For example, the pin actuator 233 may include a multilayer piezoelectric actuator, a voice coil motor, a rack and pinion combined with a motor, or the like.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," "substantially perpendicular," or "substantially planar," may be exactly the same, equal, perpendicular, or planar, or may be the same, equal, perpendicular, or planar within acceptable variations that may occur, for example, due to manufacturing processes.

The pressing pin 231 may be driven by the pin actuator 233 to press a central portion of the second substrate S2. During bonding between the first substrate S1 and the second substrate S2, the pressing pin 231 may be configured to press down the central portion of the second substrate S2 toward the first substrate S1 such that the displacement of the central portion of the second substrate S2 varies. For example, the height of the central portion of the second substrate S2 may vary with respect to other parts (e.g., edge portions) of the second substrate S2 while the pressing pin 231 presses the central portion of the second substrate S2. Heights as described in the present disclosure may be distances in the Z direction from a base level.

In an example embodiment, at least one selected from the first bonding chuck 100a and the second bonding chuck 200 may include a chuck actuator 260 to control the distance between the first bonding chuck 100a and the second bonding chuck 200.

For example, the second bonding chuck 200 may include the chuck actuator 260, and the first bonding chuck 100a may not include any chuck actuator. In this case, the chuck actuator 260 may control the distance between the first bonding chuck 100a and the second bonding chuck 200 by moving the second bonding chuck 200 downwards/upwards. However, embodiments are not limited thereto, and each of the first bonding chuck 100a and the second bonding chuck 200 may include a chuck actuator like the chuck actuator 260.

The process gas injector 300 may surround at least one selected from the first bonding chuck 100a and the second bonding chuck 200. For example, the process gas injector 300 may surround the first bonding chuck 100a. For example, in a plan view of the process gas injector 300 when the process gas injector 300 is viewed from above, the process gas injector 300 may have a ring shape surrounding at least one selected from the first bonding chuck 100a and the second bonding chuck 200.

The process gas injector 300 may be configured to inject a process gas (G1 in FIG. 3) between the first substrate S1 and the second substrate S2. In an example embodiment, the process gas injector 300 may be configured to inject the process gas G1 in a direction substantially parallel with the first bonding surface of the first substrate S1 and the second bonding surface of the second substrate S2. The process gas injector 300 may also be configured to inject the process gas G1 in a direction from an edge portion of the first substrate S1 toward a central portion of the first substrate S1.

The process gas G1 injected by the process gas injector 300 may be hardly reactive to the first substrate S1, a material film on the first substrate S1, the second substrate S2, a material film on the second substrate S2, and so on. For example, the process gas G1 may include helium (He), nitrogen ($N_2$), argon (Ar), or a combination thereof.

In an example embodiment, the process gas injector 300 may be configured to inject the process gas G1 near the edge of a bonding space between the first substrate S1 and the second substrate S2 at a uniform speed and a uniform pressure in a substrate bonding process. For example, the process gas injector 300 may be disposed at a vertical height between the vertical heights of the first bonding chuck 100a and the second bonding chuck 200. Heights as described in the present disclosure may be distances in the Z direction from a base level, e.g., from a bottom surface of the chamber 11.

For this configuration, the process gas injector 300 may include an air knife having a process gas injection hole H1 having a ring shape surrounding the first substrate S1 and the second substrate S2, e.g., in a plan view. In an example embodiment, the process gas injector 300 may correspond to an air knife including a ring-shaped nozzle surrounding the first substrate S1 and the second substrate S2, e.g., in a plan view. The process gas injection hole H1 may be formed in the nozzle to have a ring shape extending along the extension direction of the nozzle. For example, the air knife may be disposed at a height in the Z direction between the heights of the first and second substrates S1 and S2 disposed on respective surfaces of the first and second bonding chucks 100a and 200. For example, the gas injector 300, the air knife, and/or the process gas injection hole H1 may be disposed at a height higher than a height of the first substrate S1 disposed on the first bonding chuck 100a.

In an example embodiment, the process gas injector 300 may include an injection angle adjuster 310 configured to adjust the injection angle of the process gas G1. The injection angle adjuster 310 may be configured to adjust the injection angle of the process gas G1 according to the bonding level between the first substrate S1 and the second substrate S2. For example, the injection angle adjuster 310 may change the injection angle/direction of the process gas G1 to inject the process gas G1 in predetermined directions while the bonding of the first and second substrates S1 and S2 is performed.

In an example embodiment, when the shape of the first substrate S1 and the second substrate S2 changes due to bonding between the first substrate S1 and the second substrate S2, the injection angle adjuster 310 may adjust the injection angle of the process gas G1. For example, when the curvature of the first substrate S1 and the second substrate S2 changes due to bonding between the first substrate S1 and the second substrate S2, the injection angle adjuster 310 may adjust the injection angle of the process gas G1 based on a change in the curvature of at least one selected from the first substrate S1 and the second substrate S2.

Because the injection angle adjuster 310 may adjust the injection angle of the process gas G1 according to the bonding level/state between the first substrate S1 and the second substrate S2, the efficiency of supplying the process gas G1 between the first substrate S1 and the second substrate S2 may be increased. For example, because the process gas injector 300 may include the injection angle adjuster 310, the process gas G1 may be intensively supplied to an area, in which a void may be relatively frequently formed by the condensation of vapor. For example, the injection angle adjuster 301 may be controlled so that the process gas G1 is injected in various angles during the bonding process.

In an example embodiment, in the plan view of the process gas injector 300 described above, the process gas injector 300 may have a ring shape and may be symmetrical with respect to the center of a ring. A first injection angle, at which the process gas G1 is injected from a first region of the process gas injector 300, may be substantially the same as a second injection angle, at which the process gas G1 is injected from a second region facing the first region. For example, the first injection angle may be an angle of a first injection of the process gas G1 with respect to a horizontal plane and the second injection angle may be an angle of a second injection of the process gas G1 with respect to the horizontal plane. For example, both of the first and second injections proceed toward the center of a top surface of the first bonding chuck 100a in a plan view.

In an example embodiment, the process gas injector 300 may be connected to a process gas source 330 and a process gas supply line 340. The process gas source 330 may include the process gas G1. The process gas supply line 340 may extend between the process gas source 330 and the process gas injector 300 and provide a passage for the flow of the process gas G1 between the process gas source 330 and the process gas injector 300. A process gas valve 350 configured to open or close the passage of the process gas G1 may be provided on the process gas supply line 340.

In an example embodiment, the process gas injector 300 may inject the process gas G1 into the bonding space between the first substrate S1 and the second substrate S2 during a substrate bonding process. When the substrate bonding process is completed, the process gas injector 300 may stop injecting the process gas G1. The process gas G1 injected during the substrate bonding process may be discharged from the chamber 11 by an exhaust unit (not shown).

The air curtain generator 400, also described as an air curtain injector or air curtain supply, may be provided at an outside of the process gas injector 300, e.g., in a plan view. For example, the air curtain generator 400 may be provided on a ceiling of the chamber 11 to be at the outside of the process gas injector 300, e.g., in a plan view.

In an example embodiment, in a plan view of the air curtain generator 400, the air curtain generator 400 may have a ring shape surrounding the first substrate S1 and the second substrate S2. For example, the air curtain generator 400 may include a ring-shaped nozzle, and an air curtain forming gas injection hole (not shown) may be formed in the nozzle to extend in the extension direction of the nozzle. For example, when the air curtain generator 400 is viewed from below, the air curtain generator 400 may have the air curtain forming gas injection hole in a ring shape surrounding the first bonding chuck 100a and the second bonding chuck 200.

The air curtain generator 400 may be configured to inject an air curtain forming gas (G2 in FIG. 3) through the air curtain forming gas injection hole to form an air curtain surrounding the first substrate S1 and the second substrate S2. In an example embodiment, the air curtain generator 400 may be configured to inject the air curtain forming gas G2 in a direction substantially perpendicular to the first bonding surface of the first substrate S1 and the second bonding surface of the second substrate S2. For example, a direction, in which the air curtain generator 400 injects the air curtain forming gas G2, may be substantially perpendicular to a direction, in which the process gas injector 300 injects the process gas G1.

When the air curtain generator 400 injects the air curtain forming gas G2 in a substrate bonding process, the air curtain forming gas G2 may form an air curtain surrounding/along the side portions of the first bonding chuck 100a, the second bonding chuck 200, and the process gas injector 300. The air curtain forming gas G2 may include nitrogen ($N_2$), clean dry air, or the like.

The air curtain formed by the air curtain forming gas G2 may define a process space, which surrounds the first bonding chuck 100a, the second bonding chuck 200, and the process gas injector 300. Because of the air curtain, a change in the atmosphere of the process space during the substrate bonding process may be decreased. For example, the air curtain may be helpful for maintaining the atmosphere in the process space during the substrate bonding process.

In an example embodiment, the air curtain generator 400 may be connected to an air curtain forming gas supply source 430 and an air curtain forming gas supply line 440. The air curtain forming gas supply source 430 may include the air curtain forming gas G2. The air curtain forming gas supply line 440 may extend between the air curtain forming gas supply source 430 and the air curtain generator 400 and provide a passage for the flow of the air curtain forming gas G2 between the air curtain forming gas supply source 430 and the air curtain generator 400. An air curtain forming gas valve 450 configured to open or close the passage of the air curtain forming gas G2 may be provided on the air curtain forming gas supply line 440.

In an example embodiment, the air curtain generator 400 may inject the air curtain forming gas G2 during a substrate bonding process. When the substrate bonding process is completed, the air curtain generator 400 may stop injecting the air curtain forming gas G2. The air curtain forming gas G2 injected during the substrate bonding process may be discharged from the chamber 11 by an exhaust unit (not shown).

The controller 500 may be configured to control a substrate bonding process using the first substrate bonding apparatus 10. In an example embodiment, the controller 500 may be configured to control the operations of the first bonding chuck 100a and the second bonding chuck 200. For example, the controller 500 may be configured to control the chuck actuator 260 involved in the movement of the first bonding chuck 100a and/or the movement of the second bonding chuck 200.

In an example embodiment, the controller 500 may be configured to control the process gas injector 300 and the air curtain generator 400. The controller 500 may be configured to control at least one selected from the kind, flow rate, temperature, pressure, and speed of the process gas G1 and the air curtain forming gas G2.

The controller 500 may also control the injection angle adjuster 310 of the process gas injector 300 to adjust the injection angle of the process gas G1 based on the bonding level/step between the first substrate S1 and the second substrate S2. For example, the controller may be programed to control each of the above mentioned elements to perform corresponding functions.

The controller 500 may be implemented by hardware, firmware, software, or a combination thereof. For example, the controller 500 may include a computing device such as a workstation computer, a desktop computer, a laptop computer, or a tablet computer. The controller 500 may include a simple controller, a complex processor such as a microprocessor, a central processing unit (CPU), or a graphics processing unit (GPU), a processor made up of software, dedicated hardware, or firmware. The controller 500 may be implemented by application-specific hardware such as a universal computer, a digital signal processor (DSP), a field programmable gate array (FPGA), or an application specific integrated circuit (ASIC).

In an example embodiment, the operation of the controller 500 may be implemented by commands stored in a machine readable medium, wherein the commands may be read and executed by at least one processor. At this time, the machine readable medium may include a mechanism that stores and/or transmits information in a form readable by a machine (e.g., a computing device). For example, the machine readable medium may include read-only memory (ROM), random access memory (RAM), magnetic disc storage media, optical storage media, flash memory devices, electrical signals, optical signals, acoustic signals, other types of radio signals (e.g., carrier waves, infrared signals, and digital signals), and other random signals.

The controller 500 may be embodied by firmware, software, routines, and instructions for performing a bonding process. For example, the controller 500 may be implemented by software that receives data for feedback, generates a signal for performing a bonding process, and performs a certain operation.

In general, when the center of the second substrate S2 contacts the first substrate S1 by applying an external force to the second substrate S2 to bond the second substrate S2 to the first substrate S1, a bonding area between the first substrate S1 and the second substrate S2 may spontaneously propagate/expand from the center toward the outer region of the second substrate S2. For example, bonding between the first substrate S1 and the second substrate S2 may gradually progress from an initial contact point between the first substrate S1 and the second substrate S2 toward the outer regions of the first substrate S1 and the second substrate S2 via spontaneous bonding propagation/expansion, without application of an external force.

At this time, the pressure between the first substrate S1 and the second substrate S2 rapidly drops near the outer regions of the first and second substrates S1 and S2, resulting in vapor condensed therebetween, and accordingly, a void may occur between the first and second substrates S1 and S2. In addition, because of the non-uniform pressure between the first and second substrates S1 and S2, bonding alignment between the first and second substrates S1 and S2 may be degraded.

According to the present example embodiment, the first substrate bonding apparatus 10 may include the process gas injector 300, thereby injecting the process gas G1 between the first substrate S1 and the second substrate S2 in a substrate bonding process. Due to the process gas G1 injected between the first substrate S1 and the second substrate S2, the pressure between first and second substrates S1 and S2 may be prevented from rapidly dropping near the outer regions of the first and second substrates S1 and S2. Accordingly, vapor may not be condensed between the first and second substrates S1 and S2, and occurrence of a void may be suppressed.

For example, the first substrate bonding apparatus 10 may include the air curtain generator 400, thereby injecting the air curtain forming gas G2 for forming an air curtain surrounding the first substrate S1 and the second substrate S2 in the substrate bonding process.

Because the air curtain formed by the air curtain forming gas G2 surrounds the first substrate S1 and the second substrate S2, the process gas G1 injected between the first substrate S1 and the second substrate S2 may be suppressed from escaping from a process space surrounded by the air curtain. Accordingly, the pressure between the first and second substrates S1 and S2 may not rapidly drop near the outer regions of the first and second substrates S1 and S2, and vapor may be prevented from being condensed between the first and second substrates S1 and S2, so that occurrence of a void may be suppressed.

For example, because the air curtain formed by the air curtain forming gas G2 may surround the first substrate S1 and the second substrate S2, a change in the atmosphere of the process space surrounded by the air curtain may decrease. Accordingly, bonding alignment between the first and second substrates S1 and S2 may be improved.

Differently from FIG. 1, the first substrate bonding apparatus 10 may include only one of the process gas injector 300 and the air curtain generator 400.

In an example embodiment, when the first substrate bonding apparatus 10 includes only the process gas injector 300 and does not include the air curtain generator 400, the pressure between first and second substrates S1 and S2 may be prevented, by the process gas G1 injected between the first and second substrates S1 and S2, from rapidly dropping near the outer regions of the first and second substrates S1 and S2. Accordingly, the pressure may not drop near the outer regions of the first and second substrates S1 and S2, and vapor may be prevented from being condensed between the first and second substrates S1 and S2, so that occurrence of a void may be suppressed.

When the first substrate bonding apparatus 10 includes only the air curtain generator 400 and does not include the process gas injector 300, an air curtain formed by the air curtain forming gas G2 may surround the first substrate S1 and the second substrate S2, so that air between the first and second substrates S1 and S2 may be suppressed from escaping from a process space surrounded by the air curtain. Accordingly, vapor may be prevented from being condensed between the first and second substrates S1 and S2, and accordingly, occurrence of a void may be suppressed.

Figure 2:
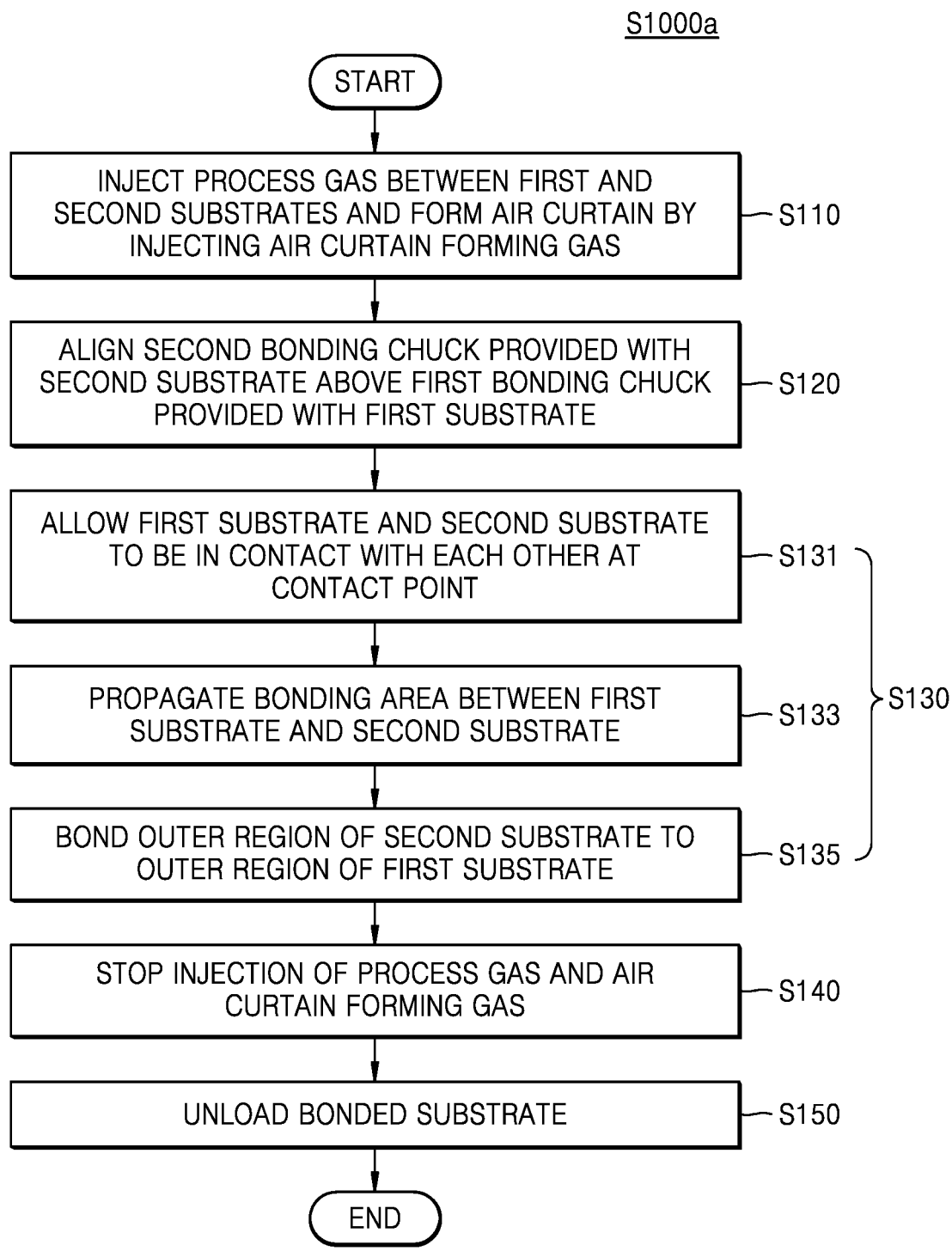
FIG. 2 is a flowchart of a first substrate bonding method according to an example embodiment.

FIG. 2 is a flowchart of a first substrate bonding method S1000a according to an example embodiment. FIGS. 3 and 4 and FIGS. 6 through 9 are conceptual diagrams showing the sequential stages in the first substrate bonding method S1000a performed by the first substrate bonding apparatus 10, according to an example embodiment. The first substrate bonding method S1000a using the first substrate bonding apparatus 10 will be described in detail with reference to FIGS. 2 through 4 and FIGS. 6 through 9 below.

Figure 3:
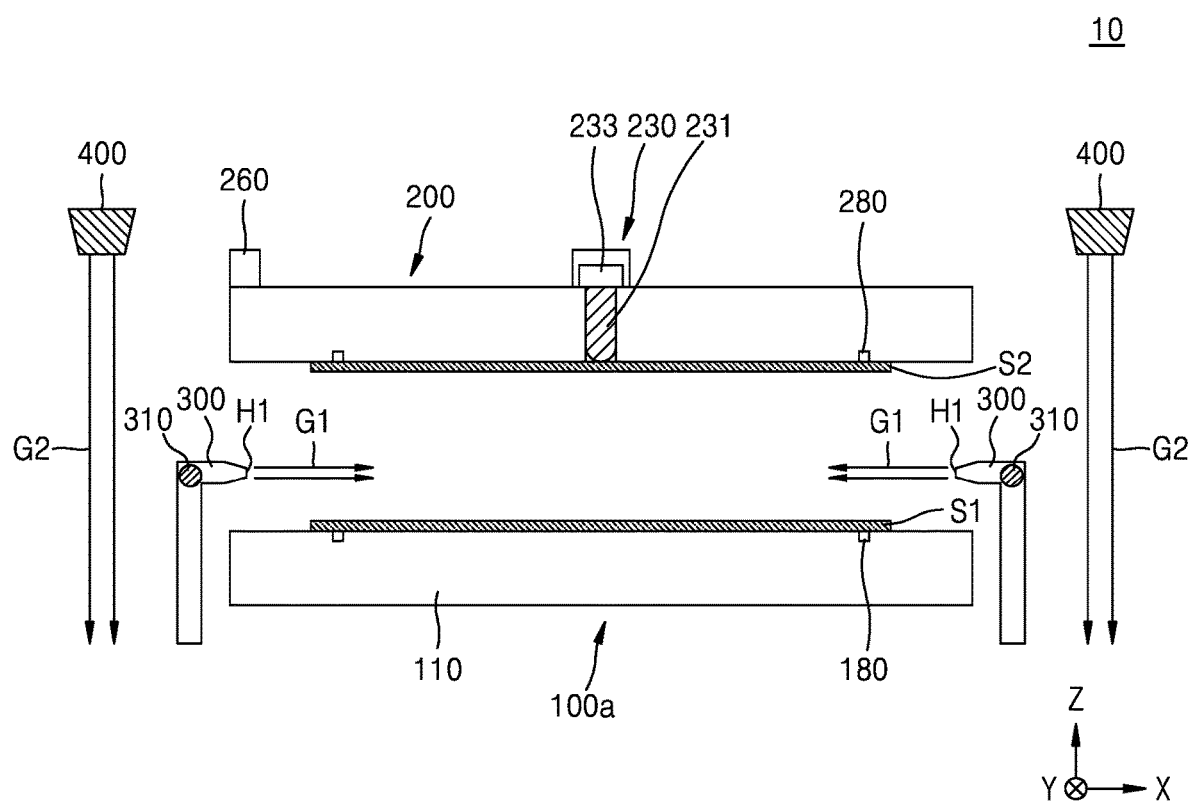
FIGS. 3 and 4 and FIGS. 6 through 9 are conceptual diagrams showing the sequential stages in the first substrate bonding method performed by the first substrate bonding apparatus, according to an example embodiment.

Referring to FIGS. 2 and 3, the first substrate bonding method S1000a may include injecting the process gas G1 between the first substrate S1 and the second substrate S2 and forming an air curtain by injecting the air curtain forming gas G2 in operation S110.

In an example embodiment, before injecting the process gas G1 between the first substrate S1 and the second substrate S2 and forming the air curtain by injecting the air curtain forming gas G2 in operation S110, the first substrate S1 and the second substrate S2 may be respectively fixed to the first bonding chuck 100a and the second bonding chuck 200.

The first bonding chuck 100a may hold (e.g., vacuum-adsorb) the first substrate S1 with the suction pressure to fix the first substrate S1 on the first bonding chuck 100a, and the second bonding chuck 200 may hold (e.g., vacuum-adsorb) the second substrate S2 with the suction pressure to fix the second substrate S2 on the second bonding chuck 200. The first substrate S1 may be mounted on the first bonding chuck 100a such that a first inactive surface is in contact with the first bonding chuck 100a, and the second substrate S2 may be mounted on the second bonding chuck 200 such that a second inactive surface is in contact with the second bonding chuck 200. The second bonding surface of the second substrate S2 mounted on the second bonding chuck 200 may face the first bonding surface of the first substrate S1 mounted on the first bonding chuck 100a.

After the first substrate S1 and the second substrate S2 are respectively fixed to the first bonding chuck 100a and the second bonding chuck 200, the process gas G1 may be injected between the first substrate S1 and the second substrate S2 and the air curtain may be formed by injecting the air curtain forming gas G2 in operation S110.

The injecting of the process gas G1 between the first substrate S1 and the second substrate S2 may include injecting the process gas G1 between the first substrate S1 and the second substrate S2 using the process gas injector 300. The process gas injector 300 may inject the process gas G1 in a direction substantially parallel with the first bonding surface of the first substrate S1 and the second bonding surface of the second substrate S2, e.g., when the first and second substrates S1 and S2 are fixed on the first and second bonding chucks 100a and 200 flatwise. The process gas injector 300 may inject the process gas G1 in a direction from the edge portion of the first and second substrates S1 and S2 toward the central portion thereof, e.g., in a plan view.

The process gas injector 300 may inject a gas that is hardly reactive to the first substrate S1, a material film on the first substrate S1, the second substrate S2, a material film on the second substrate S2, and so on. For example, the process gas G1 may include helium, nitrogen, argon, or a combination thereof. For example, the process gas G1 may be a non-reactive gas that does not react with any material included in the first and second substrates S1 and S2.

The process gas injector 300 may include an air knife having the process gas injection hole H1 having a ring shape surrounding the first substrate S1, e.g., in a plan view. For example, the gas injection hole H1 may be disposed at a height between the heights of the first and second substrates S1 and S2 disposed on the respective surfaces of the first and second bonding chucks 100a and 200. Accordingly, the process gas injector 300 may inject the process gas G1 into the edge portion of the first substrate S1 at a uniform speed and a uniform pressure.

The forming of the air curtain by injecting the air curtain forming gas G2 may include forming the air curtain, which surrounds the edges of the first and second substrates S1 and S2, using the air curtain generator 400 configured to inject the air curtain forming gas G2.

The air curtain generator 400 may inject the air curtain forming gas G2 in a direction substantially perpendicular to the direction in which the process gas G1 is injected. The air curtain forming gas G2 may include nitrogen, clean dry air, or the like.

The air curtain formed by the air curtain forming gas G2 may define a process space, which surrounds the first bonding chuck 100a, the second bonding chuck 200, and the process gas injector 300. For example, the process space may correspond to a space inside the air curtain formed by the air curtain forming gas G2. The air curtain may have a cylindrical shape surrounding the first bonding chuck 100a, the second bonding chuck 200, and the process gas injector 300. However, embodiments are not limited thereto, and the air curtain may have a polygonal pillar shape surrounding the first bonding chuck 100a, the second bonding chuck 200, and the process gas injector 300.

Figure 4:
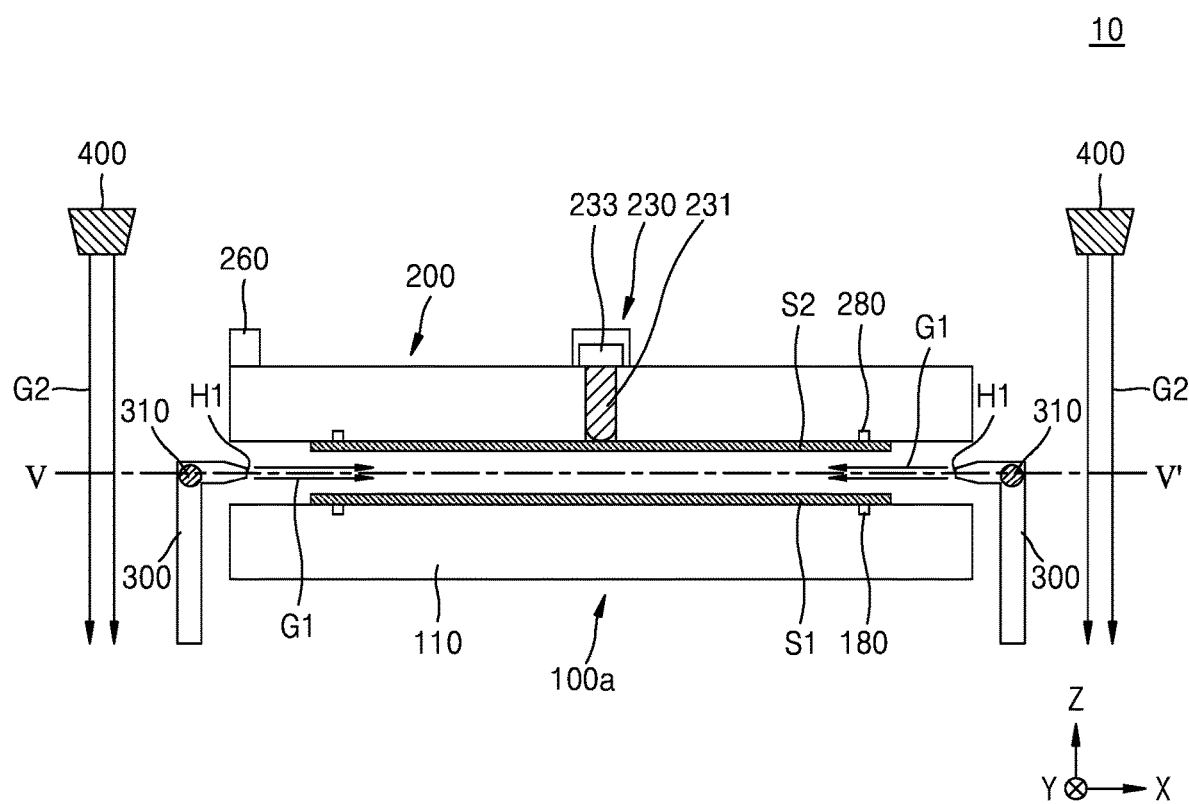

Referring to FIGS. 2 and 4, the first substrate bonding method S1000a may include aligning the second bonding chuck 200 provided with the second substrate S2 above the first bonding chuck 100a provided with the first substrate S1 in operation S120.

The second bonding chuck 200 may be aligned with the first bonding chuck 100a in a vertical direction (e.g., the Z direction). For example, the second bonding chuck 200 may be positioned above the first bonding chuck 100a by a predetermined distance. The second bonding chuck 200 may also be aligned with the first bonding chuck 100a in a horizontal direction (e.g., an X direction and/or a Y direction). For alignment between the first bonding chuck 100a and the second bonding chuck 200 in the vertical direction and/or the horizontal direction, at least one of the first and second bonding chucks 100a and 200 may move in the vertical direction and/or the horizontal direction and/or rotate around an axis parallel with the vertical direction.

When the second bonding chuck 200 is aligned above the first bonding chuck 100a in operation S120, the second bonding chuck 200 may move downwards to the first bonding chuck 100a such that the second bonding surface of the second substrate S2 is separated from the first bonding surface of the first substrate S1 by an appropriate distance determined in advance. For example, the appropriate distance between the first bonding surface of the first substrate S1 and the second bonding surface of the second substrate S2 may be about 50 µm to about 200 µm.

When the distance between the first substrate S1 and the second substrate S2 is relatively long, bonding between the first and second substrates S1 and S2 may propagate insufficiently. When the distance between the first substrate S1 and the second substrate S2 is relatively short, bonding between the first and second substrates S1 and S2 may excessively and rapidly propagate, causing a void to be formed therebetween.

To adjust the distance between first substrate S1 and the second substrate S2, the first bonding chuck 100a may be moved up, or the second bonding chuck 200 may be moved down while the first bonding chuck 100a is being moved up. As such at least one of the first bonding chuck 100a and second bonding chuck 200 is moved in a direction away from the other of the first bonding chuck 100a and second bonding chuck 200.

Figure 5:
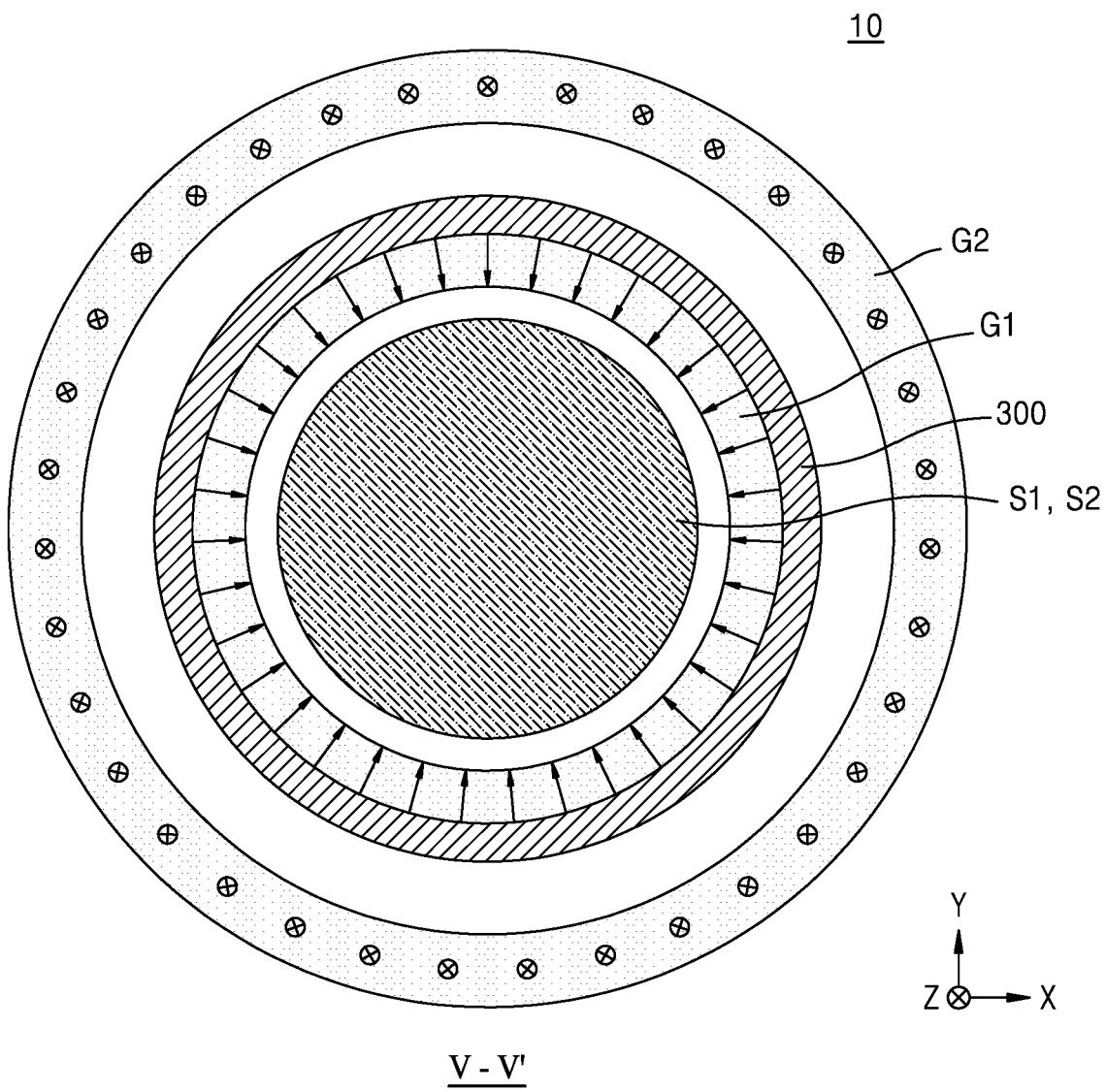
FIG. 5 is a top view of the cross-section taken along line V in FIG. 4.

FIG. 5 is a top view of the cross-section taken along line V-V' in FIG. 4.

Referring to FIG. 5, when the second bonding chuck 200 is aligned above the first bonding chuck 100a, the process gas injector 300 may inject the process gas G1 in a direction substantially parallel with the first bonding surface of the first substrate S1 and the second bonding surface of the second substrate S2. For example, the process gas injector 300 may inject the process gas G1 in a direction from the edge portion of the first and second substrates S1 and S2 toward the central portion thereof.

Because the process gas injector 300 may inject the process gas G1 between the first substrate S1 and the second substrate S2, the pressure between the first substrate S1 and the second substrate S2 may be prevented from rapidly dropping near the outer regions thereof. Accordingly, vapor may be prevented from being condensed between the first and second substrates S1 and S2.

In addition, the process gas injector 300 may inject the process gas G1 near the edge portions of the first and second substrates S1 and S2 at a uniform speed and a uniform pressure. For example, to inject the process gas G1 near the edge portions of the first and second substrates S1 and S2 at the uniform speed and the uniform pressure, the process gas injector 300 may include an air knife having the process gas injection hole H1 having a ring shape surrounding the first and second substrates S1 and S2, e.g., in a plan view.

When the second bonding chuck 200 is aligned above the first bonding chuck 100a, the air curtain generator 400 may inject the air curtain forming gas G2 in a direction substantially perpendicular to the first bonding surface of the first substrate S1 and the second bonding surface of the second substrate S2, as described above. The air curtain generator 400 may inject the air curtain forming gas G2 in a direction substantially perpendicular to the direction in which the process gas G1 is injected. The air curtain forming gas G2 may form an air curtain surrounding the outer sides of the first bonding chuck 100*a*, the second bonding chuck 200, and the process gas injector 300.

Because the air curtain generator 400 may form the air curtain surrounding the first substrate S1 and the second substrate S2, the process gas G1 injected between the first substrate S1 and the second substrate S2 may be suppressed from escaping outside the air curtain. Accordingly, the pressure between the first and second substrates S1 and S2 may not rapidly drop near the outer regions thereof, and vapor may be prevented from being condensed between the first and second substrates S1 and S2.

According to the present example embodiment, the first substrate bonding method S1000*a* may include bonding the second substrate S2 to the first substrate S1 in operation S130. Operation S130 may include allowing the first substrate S1 and the second substrate S2 to be in contact with each other at a contact point in operation S131, propagating a bonding area between the first substrate S1 and the second substrate S2 in operation S133, and bonding an outer region of the second substrate S2 to an outer region of the first substrate S1 in operation S135.

Figure 6:
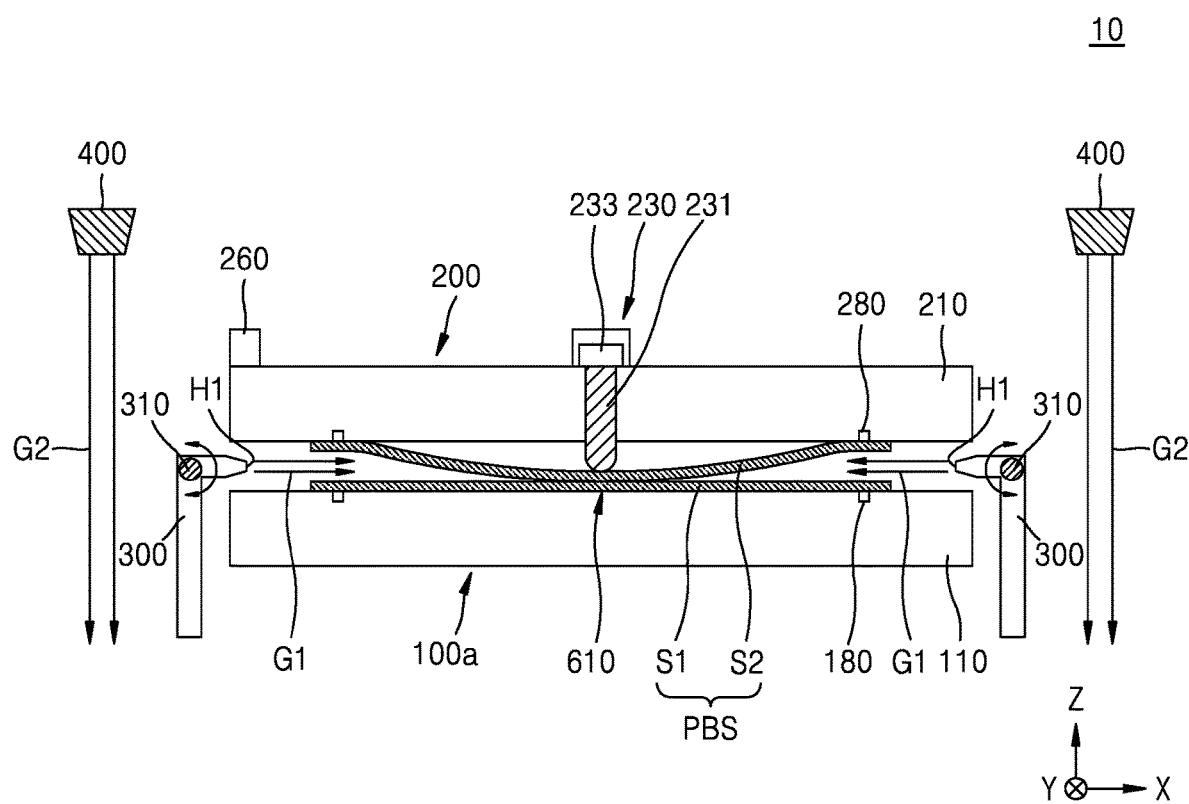

Referring to FIGS. 2 and 6, the first substrate bonding method S1000*a* may include allowing the first substrate S1 and the second substrate S2 to be in contact with each other at the contact point in operation S131.

For example, operation S131 may include pressing the center of the second substrate S2 using the pressing pin 231 of the second bonding chuck 200, allowing the central portion of the second substrate S2 pressed by the pressing pin 231 to bulge toward the first substrate S1, and allowing the first substrate S1 and the second substrate S2 to be in contact with each other at the contact point.

The contact point at which the first substrate S1 and the second substrate S2 are in contact with each other may be defined as a bonding initiation point 610, from which bonding between the first substrate S1 and the second substrate S2 starts. For example, the bonding initiation point 610 may correspond to a point at which the center of the first bonding surface of the first substrate S1 meets/contacts the center of the second bonding surface of the second substrate S2 at the operation step S131. The first substrate S1 and the second substrate S2, which are bonded to each other at the bonding initiation point 610, may be defined as a bonding structure PBS.

Figure 7:
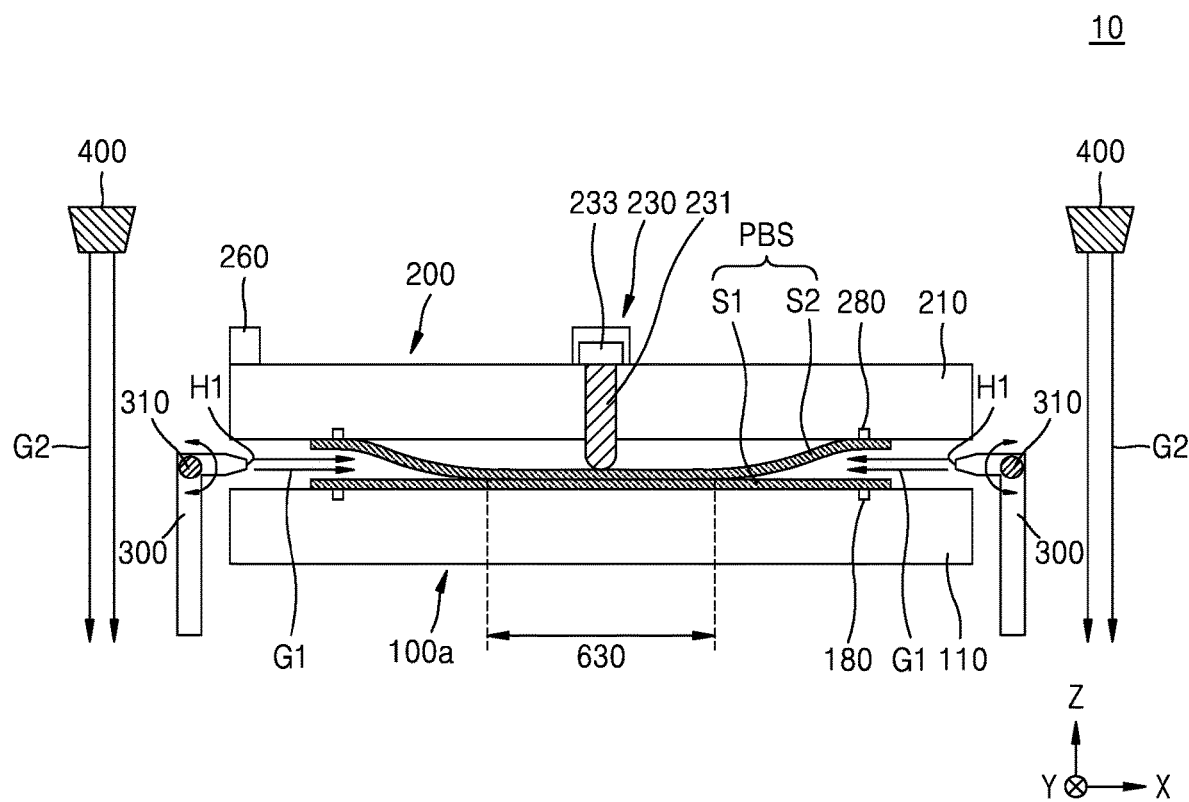
Figure 8:
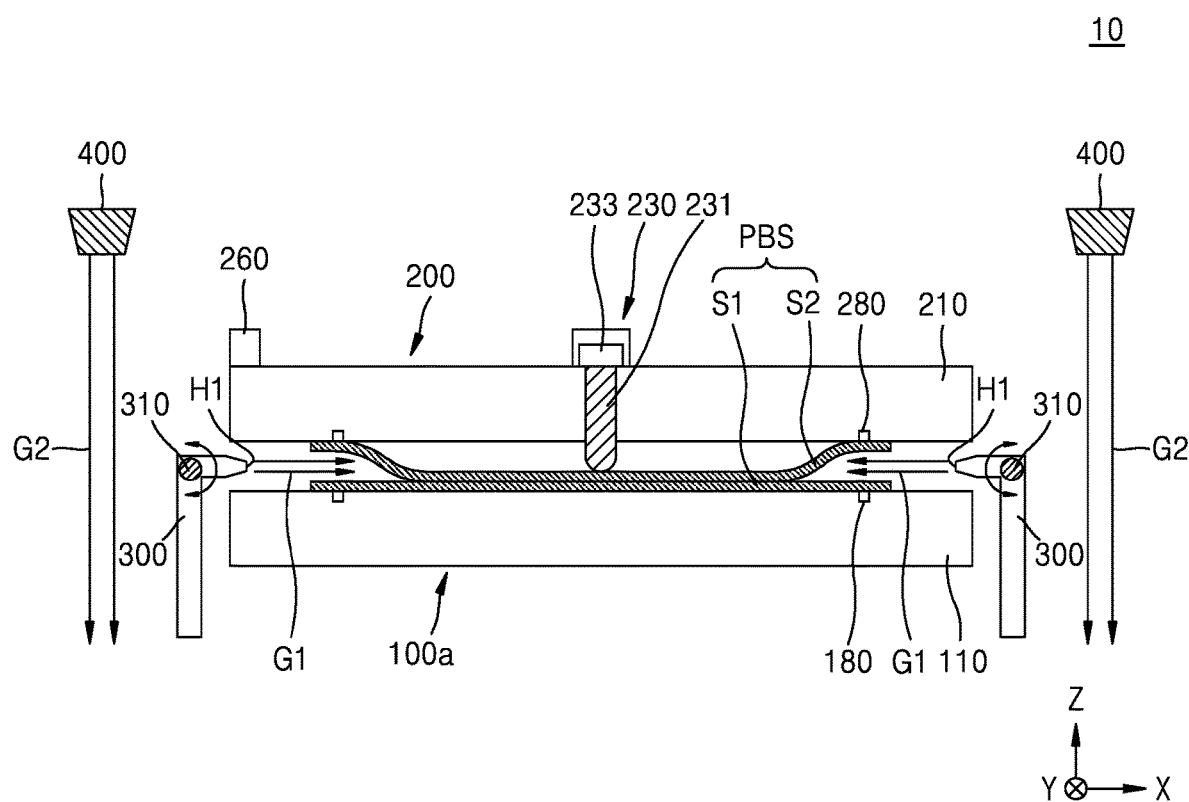

Referring to FIGS. 2, 7, and 8, the first substrate bonding method S1000*a* may include propagating the bonding area between the first substrate S1 and the second substrate S2 in operation S133.

The bonding area between the first substrate S1 and the second substrate S2 may gradually propagate from the bonding initiation point 610 (in FIG. 6) toward the outer regions of the first and second substrates S1 and S2. The bonding area between the first substrate S1 and the second substrate S2 may be defined as a portion in which the second bonding surface of the second substrate S2 is bonded to the first bonding surface of the first substrate S1, and a bonding propagation distance 630 may refer to the diameter of the bonding area or the horizontal width of the bonding area, which crosses the bonding initiation point 610.

The propagation of the bonding area between the first substrate S1 and the second substrate S2 may be spontaneously performed without application of an external force. For example, the first bonding surface of the first substrate S1 and the second bonding surface of the second substrate S2 may have undergone plasma processing or wet processing. For example, the first bonding surface and the second bonding surface may be treated with plasma or a liquid chemical before the first and second substrates S1 and S2 are loaded in the first substrate bonding apparatus 10. Because the first bonding surface of the first substrate S1 and the second bonding surface of the second substrate S2 have the —OH functional group thereon, the —OH functional group of the first bonding surface of the first substrate S1 may be spontaneously bonded to the —OH functional group of the second bonding surface of the second substrate S2 via a hydrogen bond.

Because the second bonding chuck 200 is vacuum-adsorbing (e.g., holding) the outer region of the second substrate S2 with the vacuum force when the bonding area between the first substrate S1 and the second substrate S2 propagates in operation S133, the bonding area between the first substrate S1 and the second substrate S2 does not propagate to the outer regions therebetween. For example, the bonding area may propagate only to a point where an attractive force between the surfaces of the first and second substrates S1 and S2 is balanced with an elastic restoring force of the second substrate S2.

In an example embodiment, when the bonding area between the first substrate S1 and the second substrate S2 propagates in operation S133, the process gas G1 may be supplied between the first substrate S1 and the second substrate S2 by the process gas injector 300 and the air curtain forming gas G2 may be injected by the air curtain generator 400 to form the air curtain surrounding the first substrate S1 and the second substrate S2.

With the propagation of the bonding area between the first substrate S1 and the second substrate S2, a tilt angle of an edge portion of the second substrate S2 may be changed. The controller 500 may control the injection angle adjuster 310 of the process gas injector 300 based on a change in the tilt angle of the edge portion of the second substrate S2. For example, as the bonding area between the first substrate S1 and the second substrate S2 propagates, the controller 500 may control the injection angle adjuster 310 of the process gas injector 300 based on a change in the curvature of the second substrate S2.

Accordingly, the efficiency of supplying the process gas G1 between the first substrate S1 and the second substrate S2 may increase. By controlling the injection angle adjuster 310, the process gas G1 may be intensively supplied to an area, in which a void may be relatively frequently formed by the condensation of vapor.

Figure 9:
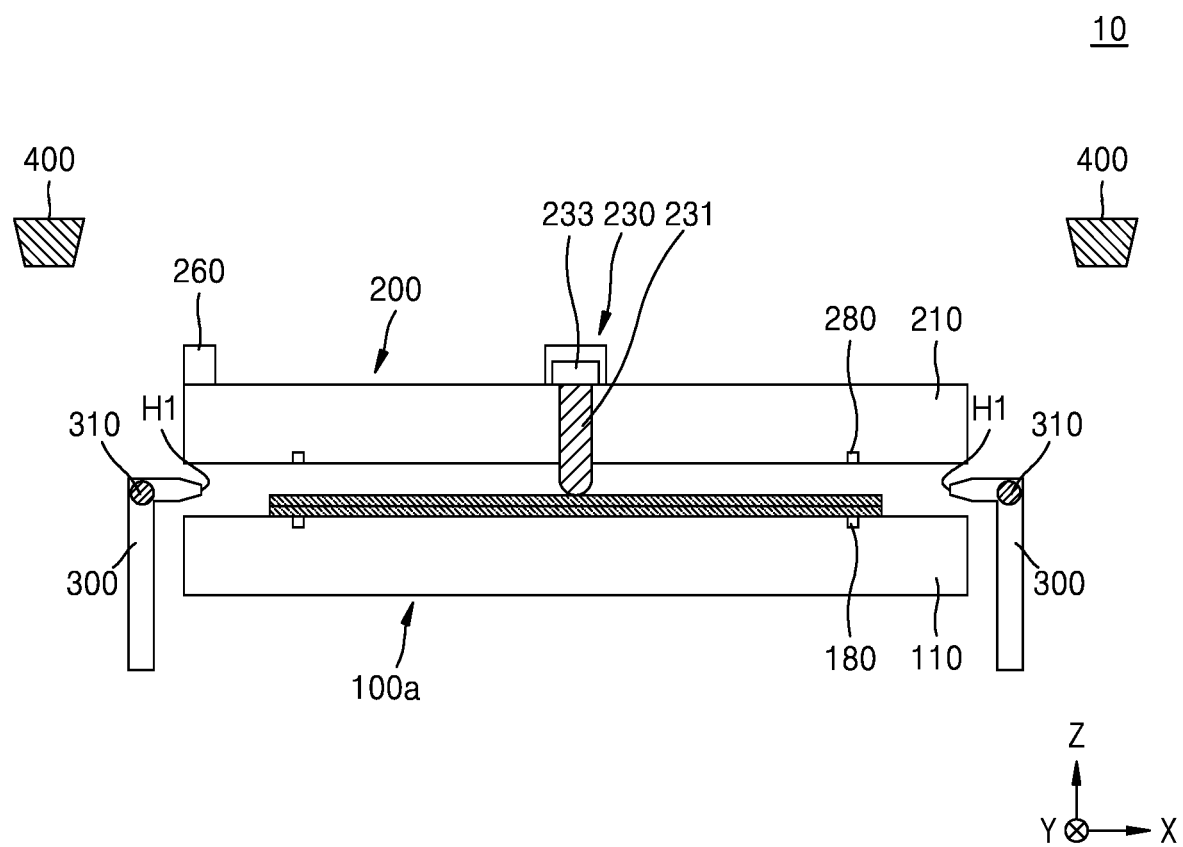

Referring to FIGS. 2 and 9, the first substrate bonding method S1000*a* may include bonding the outer region of the second substrate S2 to the outer region of the first substrate S1 in operation S135, stopping injection of the process gas G1 and the air curtain forming gas G2 in operation S140, and unloading a bonded substrate BS in operation S150.

When the second bonding chuck 200 releases vacuum-adsorption of the outer region of the second substrate S2, the outer region of the second substrate S2 may free-fall to the outer region of the first substrate S1 and may be bonded to the outer region of the first substrate S1 in operation S135. When bonding between the outer region of the first substrate S1 and the outer region of the second substrate S2 is completed, the bonded substrate BS, in which the bonding surface of the first substrate S1 and the bonding surface of the second substrate S2 are fully bonded to each other, may be formed.

When the bonding between the first substrate S1 and the second substrate S2 is completed, the injection of the process gas G1 and the air curtain forming gas G2 may be stopped in operation S140.

After completion of the bonding between the first substrate S1 and the second substrate S2, the bonded substrate BS may be unloaded in operation S150. To unload the bonded substrate BS, the first bonding chuck 100a may completely release vacuum-adsorption (e.g., suction pressure holding) of the bonded substrate BS. The second bonding chuck 200 may be moved away from the first bonding chuck 100a.

According to the present example embodiment, the first substrate bonding method S1000a may include injecting the process gas G1 and the air curtain forming gas G2 in operation S110 before aligning the first bonding chuck 100a and the second bonding chuck 200 with each other in operation S120. Accordingly, when the first substrate S1 is bonded to the second substrate S2, the pressure between the first substrate S1 and the second substrate S2 may be prevented from rapidly dropping near the outer regions thereof, and vapor may be prevented from being condensed between the first and second substrates S1 and S2, thereby suppressing occurrence of a void in the bonding area between the first and second substrates S1 and S1.

Figure 10:
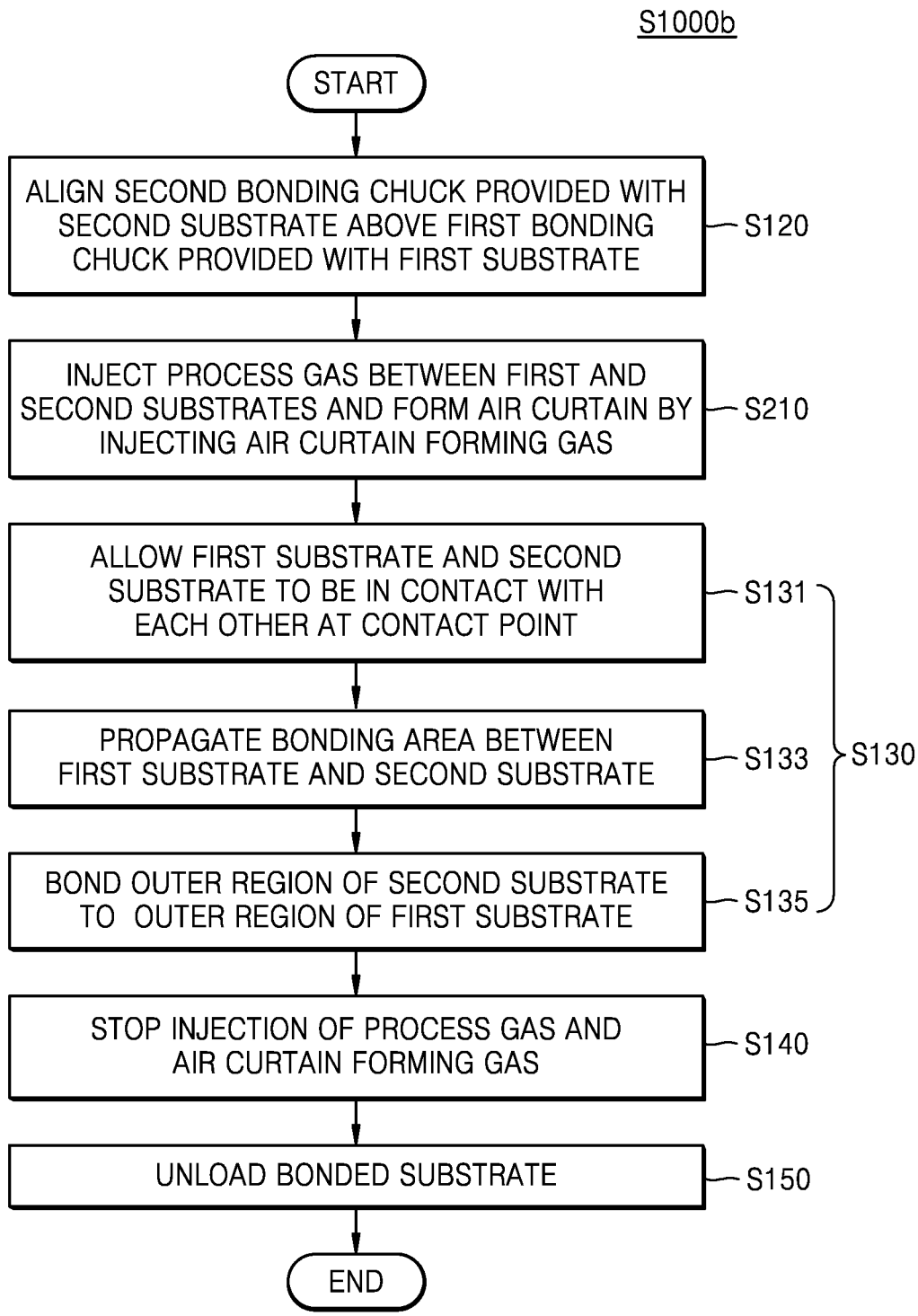
FIG. 10 is a flowchart of a second substrate bonding method according to an example embodiment.

FIG. 10 is a flowchart of a second substrate bonding method S1000b according to an example embodiment. Descriptions below will be focused on differences between the first substrate bonding method S1000a and the second substrate bonding method S1000b.

Referring to FIG. 10, operation S210 of injecting the process gas G1 between the first substrate S1 and the second substrate S2 and forming an air curtain by injecting the air curtain forming gas G2 may be performed after aligning the second bonding chuck 200 above the first bonding chuck 100a in operation S120.

Operation S210 may be performed before bonding the second substrate S2 to the first substrate S1 in operation S130.

Figure 11:
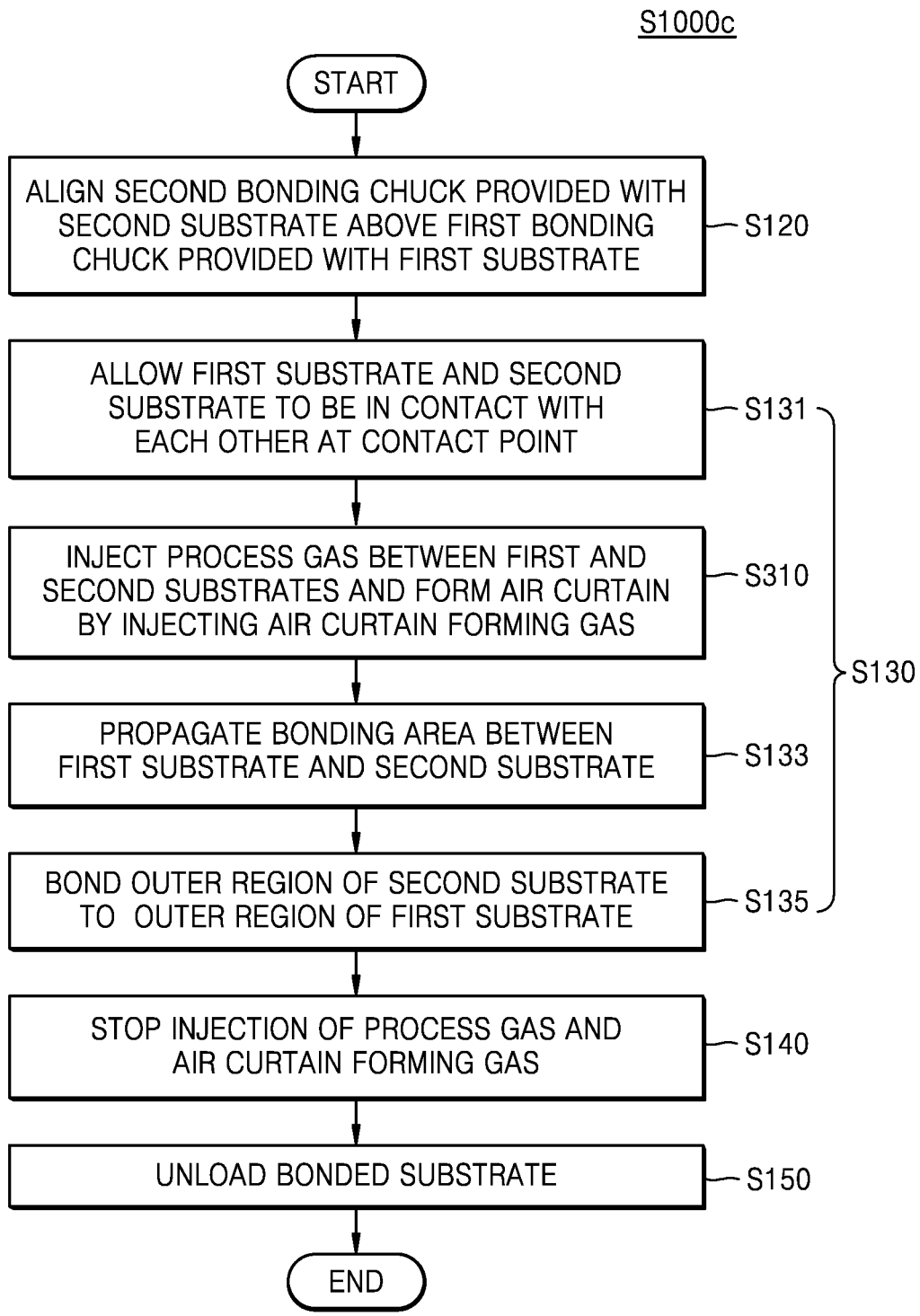
FIG. 11 is a flowchart of a third substrate bonding method according to an example embodiment.

FIG. 11 is a flowchart of a third substrate bonding method S1000c according to an example embodiment.

Referring to FIG. 11, operation S310 of injecting the process gas G1 between the first substrate S1 and the second substrate S2 and forming an air curtain by injecting the air curtain forming gas G2 may be performed after the second substrate S2 is at least partially bonded to the first substrate S1.

In an example embodiment, operation S310 may be performed after allowing the first substrate S1 and the second substrate S2 to be in contact with each other at the contact point in operation S131 and before propagating the bonding area between the first substrate S1 and the second substrate S2 in operation S133.

Figure 12:
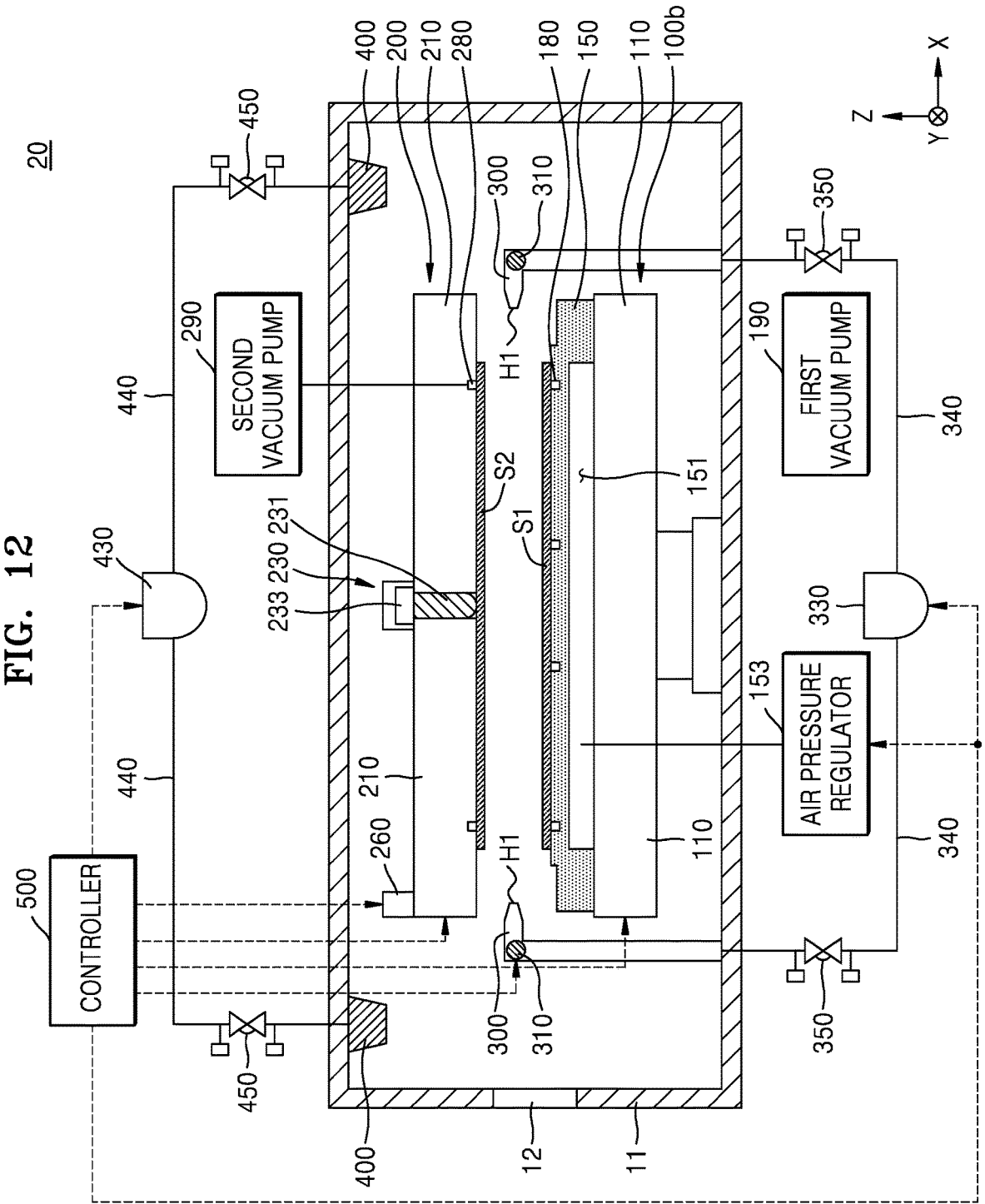
FIG. 12 is a cross-sectional view of a second substrate bonding apparatus according to an example embodiment.

FIG. 12 is a cross-sectional view of a second substrate bonding apparatus 20 according to an example embodiment.

Referring to FIG. 12, the second substrate bonding apparatus 20 may include the chamber 11, a first bonding chuck 100b, the second bonding chuck 200, the process gas injector 300, the air curtain generator 400, and the controller 500. Descriptions below will be focused on differences between the first substrate bonding apparatus 10 and the second substrate bonding apparatus 20.

The first bonding chuck 100b may include a deformation plate 150 mounted on the first base 110. The deformation plate 150 may include the first vacuum recess 180, in which vacuum pressure may be formed. The first vacuum pump 190 may apply vacuum pressure to the first vacuum recess 180 such that the first substrate S1 is vacuum-adsorbed (e.g., adheres) to a surface of the deformation plate 150 and may release the vacuum pressure of the first vacuum recess 180 such that the vacuum-adsorption (e.g., suction pressure) exerted on the first substrate S1 is released.

The deformation plate 150 may be mounted on the first base 110 such that the distance between the deformation plate 150 and the first base 110 may be variable. For example, while the circumference of the deformation plate 150 is fixed to the first base 110, an inner/central portion of the deformation plate 150 may be adjustable and be deformed to bulge by an external force. The deformation plate 150 may be deformed while supporting the first substrate S1, thereby forcibly deforming the first substrate S1. At this time, the curvature of the first substrate S1 that is forcibly deformed may be controlled by the curvature of the deformation plate 150.

In an example embodiment, the deformation plate 150 may include metal, ceramic, rubber, or a combination thereof. For example, the deformation plate 150 may include aluminum or silicon carbide (SiC).

An air pressure regulator 153 may deform the deformation plate 150 by regulating the pressure of a cavity 151 formed between the first base 110 and the deformation plate 150. The air pressure regulator 153 may increase the pressure of the cavity 151 by injecting air into the cavity 151 and decrease the pressure of the cavity 151 by expelling air from the cavity 151. When the pressure of the cavity 151 is increased by the air pressure regulator 153, the deformation plate 150 may be deformed to have increasing curvature, and the first substrate S1 supported by the deformation plate 150 may also be deformed to have increasing curvature. When the pressure of the cavity 151 is decreased by the air pressure regulator 153, the deformation plate 150 may be deformed to have decreasing curvature, and the first substrate S1 supported by the deformation plate 150 may also be deformed to have decreasing curvature. For example, the first substrate S1 may have substantially the same curvature as the curvature of the deformation plate 150 in certain steps of the bonding process.

FIGS. 13 through 18 are conceptual diagrams showing the sequential stages in a substrate bonding method performed by the second substrate bonding apparatus 20, according to an example embodiment.

Figure 13:
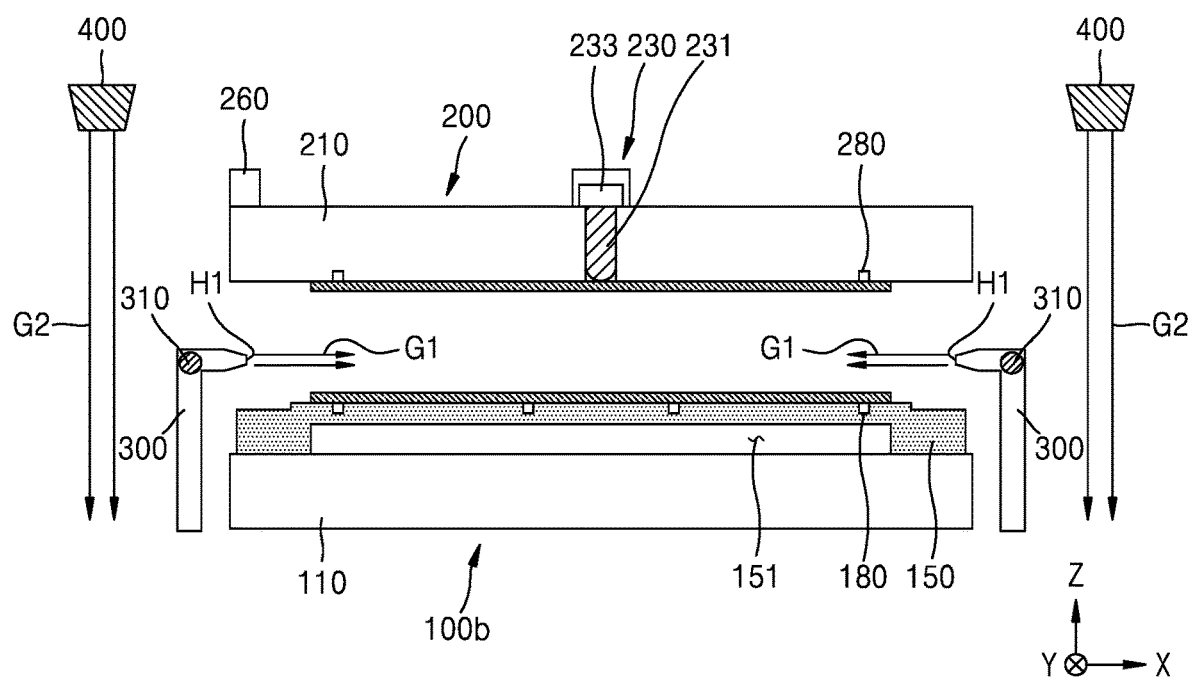
FIGS. 13 through 18 are conceptual diagrams showing the sequential stages in a substrate bonding method performed by the second substrate bonding apparatus, according to an example embodiment.

Referring to FIG. 13, the substrate bonding method performed by the second substrate bonding apparatus 20 may include injecting the process gas G1 between the first substrate S1 and the second substrate S2 and forming an air curtain by injecting the air curtain forming gas G2.

The process gas injector 300 may inject the process gas G1 in a direction substantially parallel with the first bonding surface of the first substrate S1 and the second bonding surface of the second substrate S2. The process gas injector 300 may also inject the process gas G1 in a direction from the edge portions of the first and second substrates S1 and S2 toward the central portions thereof.

The process gas injector 300 may include an air knife having the process gas injection hole H1 having a ring shape surrounding the first substrate S1, e.g., in a plan view. For example, the gas injection hole H1 may be positioned at a height between the heights of the first and second substrates S1 and S2 disposed on the respective surfaces of the first and second bonding chucks 100b and 200. Accordingly, the process gas injector 300 may inject the process gas G1 into the edge portion of the first substrate S1 at a uniform speed and a uniform pressure.

The air curtain generator 400 may inject the air curtain forming gas G2 to form an air curtain. The air curtain forming gas G2 injected by the air curtain generator 400 may form an air curtain surrounding the edges of the first and second substrates S1 and S2. The air curtain generator 400 may inject the air curtain forming gas G2 in a direction substantially perpendicular to the direction in which the process gas G1 is injected.

The air curtain formed by the air curtain generator 400 may define a process space, which surrounds the first bonding chuck 100b, the second bonding chuck 200, and the process gas injector 300.

Figure 14:
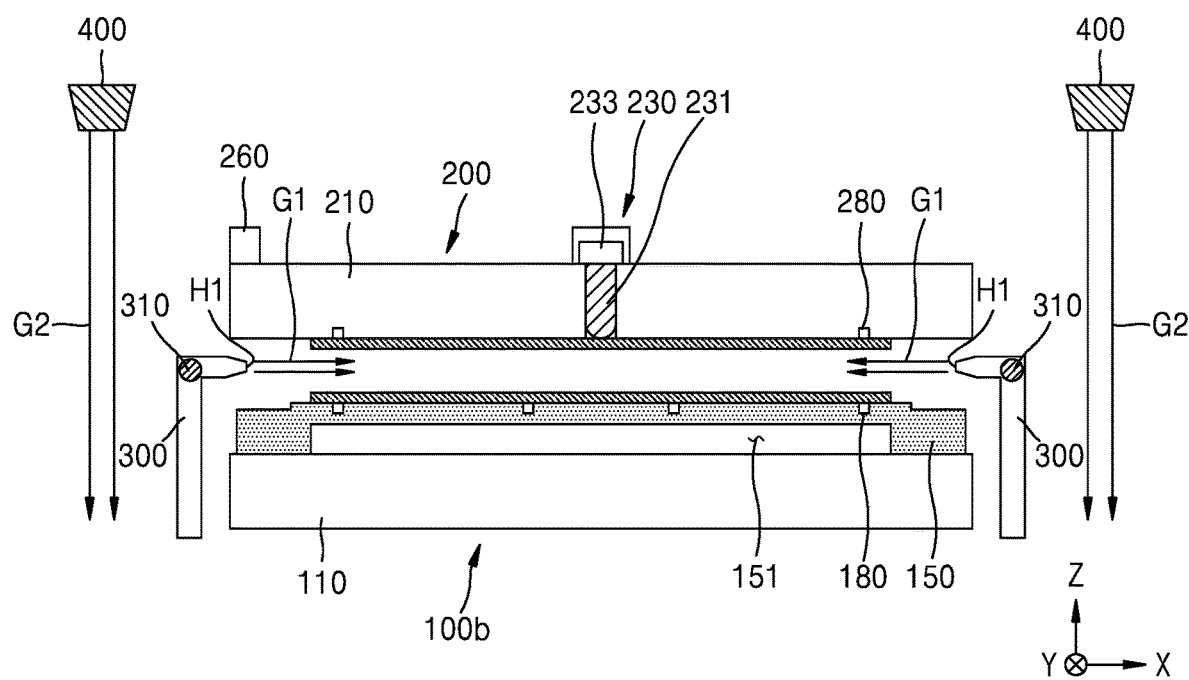

Referring to FIG. 14, the substrate bonding method performed by the second substrate bonding apparatus 20 may include aligning the second bonding chuck 200 provided with the second substrate S2 above the first bonding chuck 100b provided with the first substrate S1. The aligning of the second bonding chuck 200 above the first bonding chuck 100b may be the same as the descriptions given above with reference to FIG. 4, and thus detailed descriptions thereof will be omitted.

Figure 15:
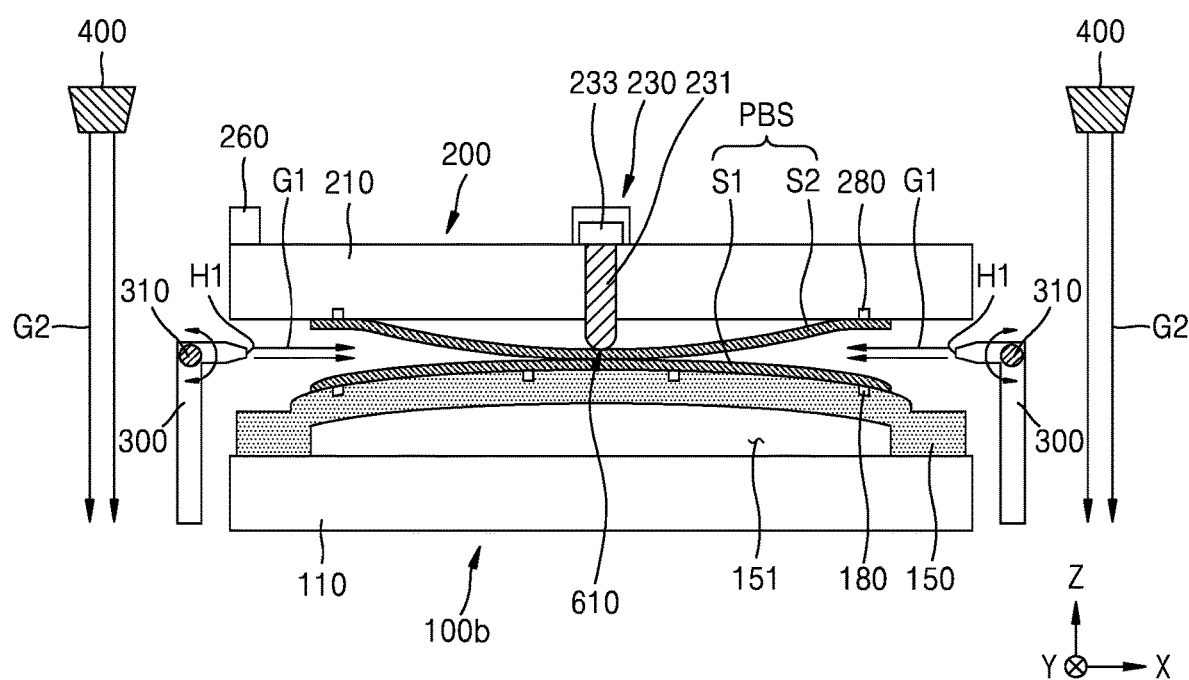

Referring to FIG. 15, the substrate bonding method performed by the second substrate bonding apparatus 20 may include allowing the first substrate S1 and the second substrate S2 to be in contact with each other at a contact point.

In an example embodiment, the deformation plate 150 may be deformed while supporting the first substrate S1 such that the first substrate S1 supported on a surface of the deformation plate 150 may be forcibly deformed. For example, the deformation plate 150 may be deformed to bulge upwards while vacuum-adsorbing (e.g., holding) the first substrate S1 with the suction pressure, and the first substrate S1 may be forcibly deformed to bulge upwards in correspondence to the deformation of the deformation plate 150.

In correspondence to the deformation of the first substrate S1, the second substrate S2 may be pressed by the pressing pin 231 to bulge downwards. With the deformation of the first substrate S1 and the second substrate S2, the first substrate S1 and the second substrate S2 may be in contact with each other at the contact point. As described above, the contact point may be referred to as the bonding initiation point 610, from which bonding between the first substrate S1 and the second substrate S2 starts.

Figure 16:
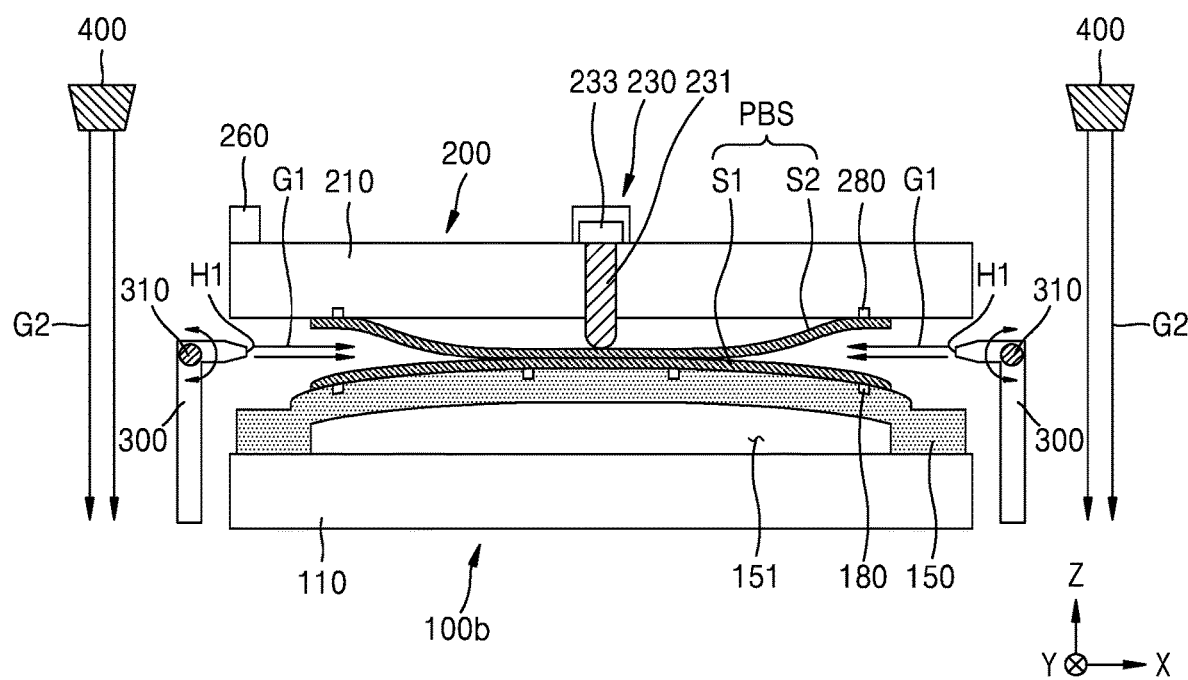
Figure 17:
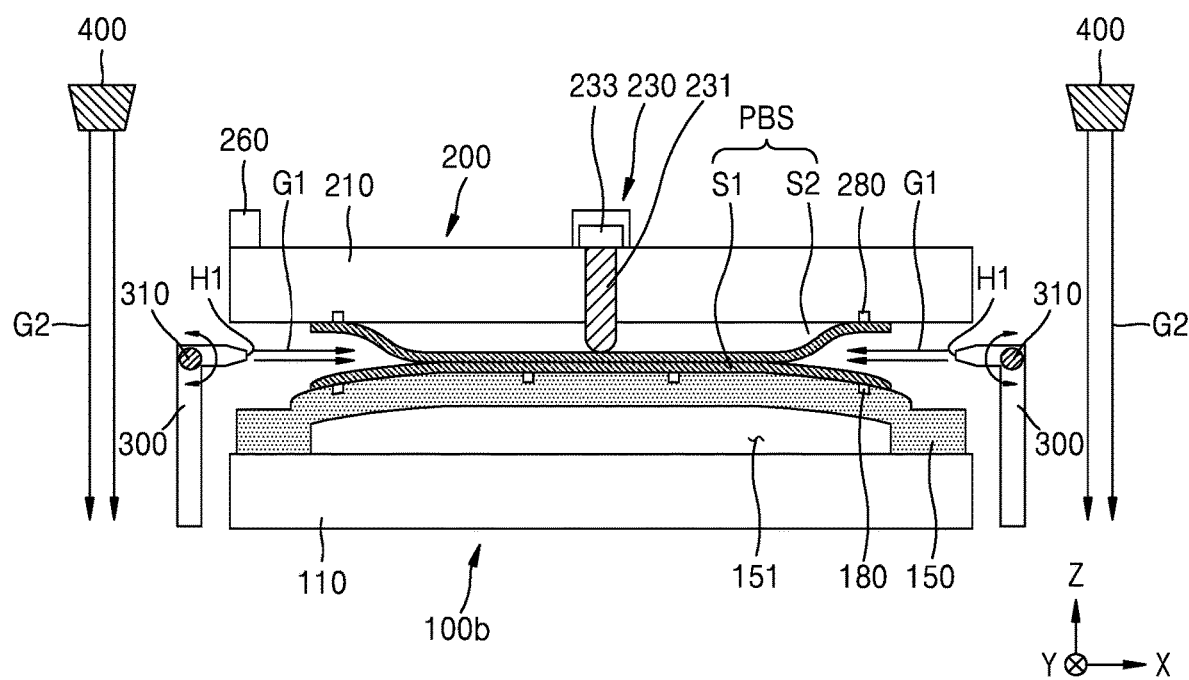

Referring to FIGS. 16 and 17, the substrate bonding method performed by the second substrate bonding apparatus 20 may include propagating the bonding area between the first substrate S1 and the second substrate S2.

For example, the bonding area between the first substrate S1 and the second substrate S2 may propagate/expand from the bonding initiation point 610 toward the outer regions of the first and second substrates S1 and S2. As described above, the bonding area between the first substrate S1 and the second substrate S2 may spontaneously propagate/expand.

In an example embodiment, when the bonding between the first substrate S1 and the second substrate S2 propagates, the chuck actuator 260 may decrease the distance between the first bonding chuck 100b and the second bonding chuck 200 to gradually flatten the surface of the deformation plate 150 from the center of the deformation plate 150 toward the edge thereof such that the first substrate S1 and the second substrate S2 are bonded to each other in a level state, e.g., in a horizontal state. At this time, to help the surface of the deformation plate 150 to be flattened, the air pressure regulator 153 may decrease the pressure of the cavity 151.

Figure 18:
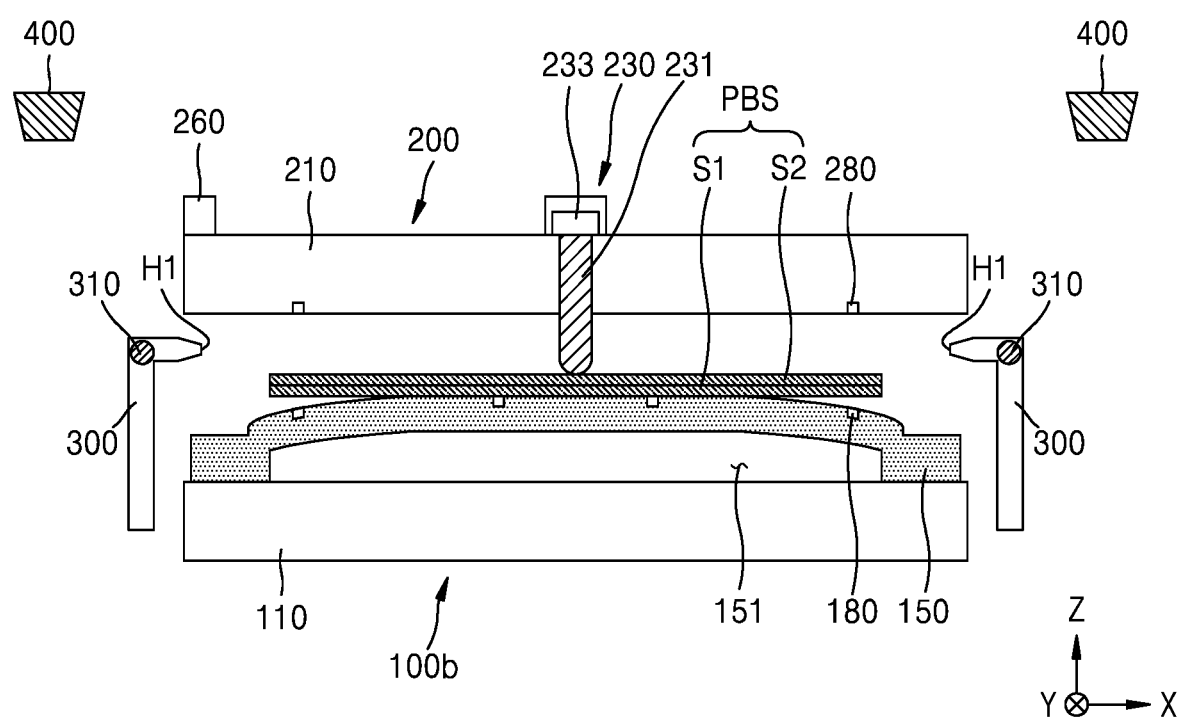

Referring to FIG. 18, the substrate bonding method performed by the second substrate bonding apparatus 20 may include bonding the outer region of the second substrate S2 to the outer region of the first substrate S1 in operation S135, stopping the injection of the process gas G1 and the air curtain forming gas G2 in operation S140, and unloading the bonded substrate BS in operation S150.

When the first and second bonding chucks 100b and 200 respectively release vacuum-adsorption (e.g., suction pressures) of the outer regions of the first and second substrates S1 and S2, the outer region of the second substrate S2 may be bonded to the outer region of the first substrate S1.

When bonding between the outer region of the first substrate S1 and the outer region of the second substrate S2 is completed, the bonding surface of the first substrate S1 and the bonding surface of the second substrate S2 are fully bonded to each other, thereby forming the bonded substrate B S.

When the bonding between the first substrate S1 and the second substrate S2 is completed, the injection of the process gas G1 and the air curtain forming gas G2 may be stopped. After completion of the bonding between the first substrate S1 and the second substrate S2, the bonded substrate BS may be unloaded.

Figure 19:
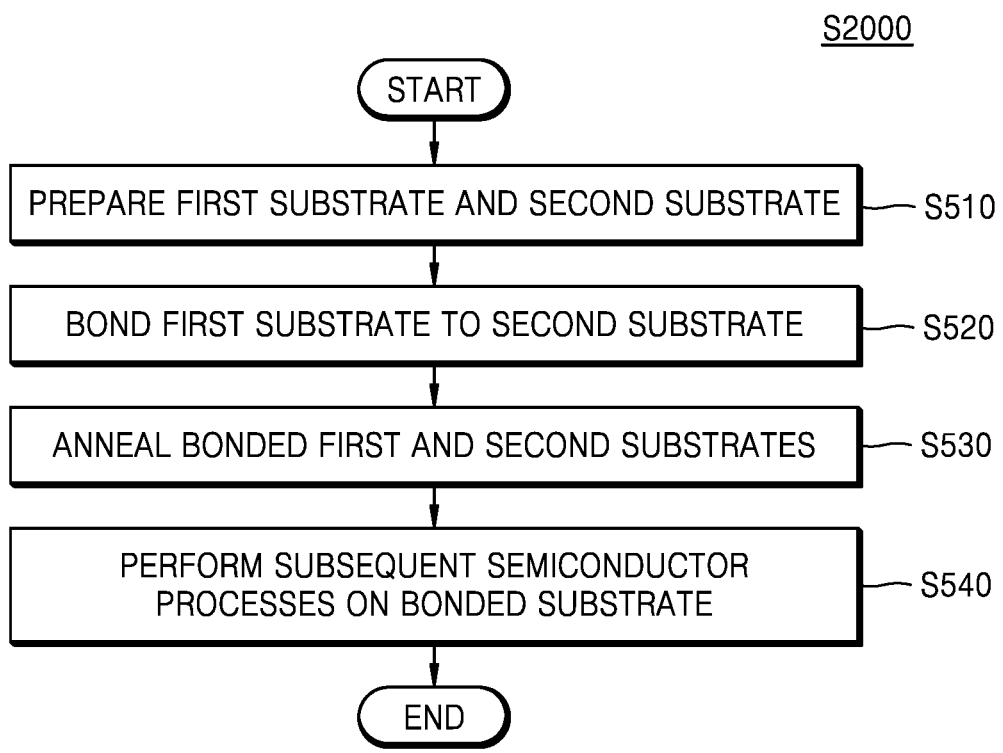
FIG. 19 is a flowchart of a method of manufacturing semiconductor devices, according to an example embodiment.
Figure 20:
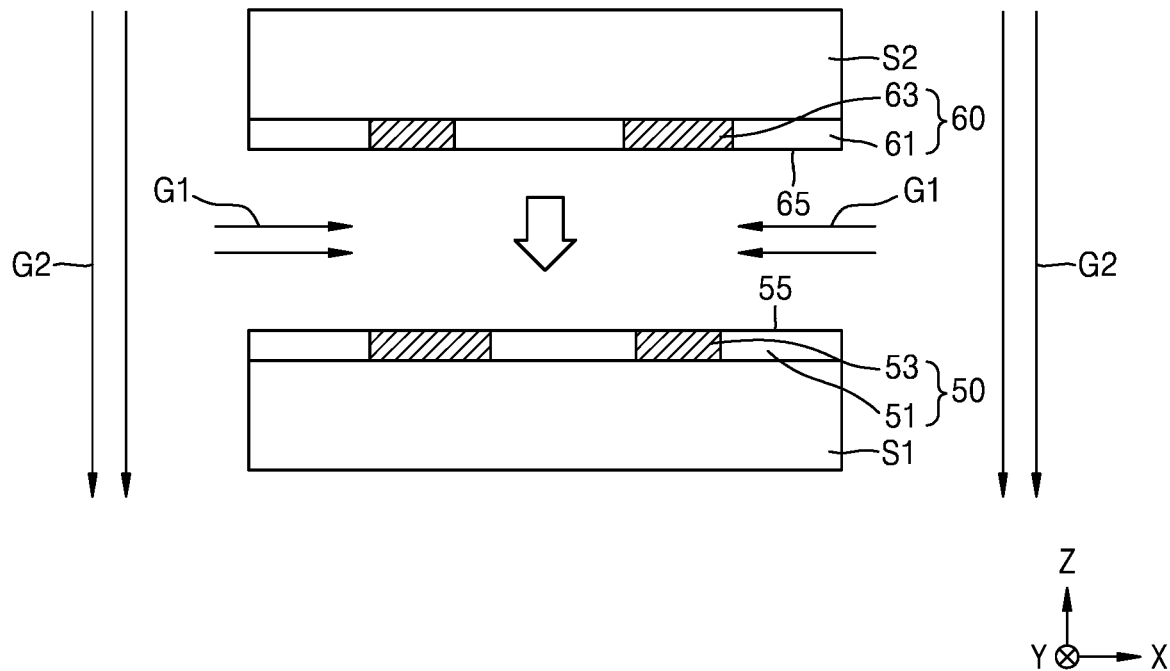
FIGS. 20 and 21 are conceptual diagrams sequentially showing a procedure for bonding a first substrate to a second substrate.
Figure 21:
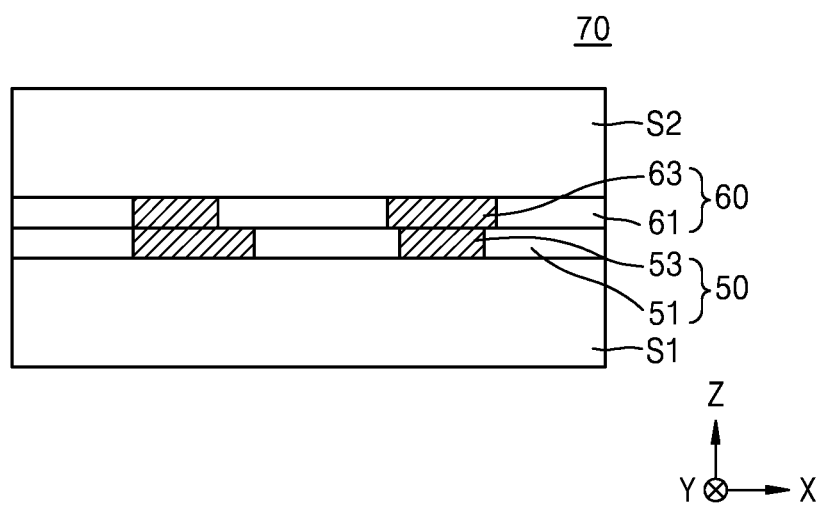

FIG. 19 is a flowchart of a method S2000 of manufacturing semiconductor devices, according to an example embodiment. FIGS. 20 and 21 are conceptual diagrams sequentially showing a procedure for bonding the first substrate S1 to the second substrate S2. The method S2000 of manufacturing semiconductor devices according to an example embodiment will be described with reference to FIGS. 19 through 21 below.

Referring to FIGS. 19 and 20, the method S2000 may include preparing the first substrate S1 and the second substrate S2, which are bonded to each other, in operation S510.

Each of the first substrate S1 and the second substrate S2 may have an active surface, on which a semiconductor structure (e.g., including semiconductor devices and circuits) is formed, and an inactive surface opposite to the active surface. The active surface corresponds to a front-side surface of each of the first substrate S1 and the second substrate S2, and the inactive surface corresponds to a back-side surface thereof.

In an example embodiment, the first substrate S1 may include a first semiconductor structure 50 on the active surface thereof, and the second substrate S2 may include a second semiconductor structure 60 on the active surface thereof.

The first substrate S1 and the second substrate S2 may be, for example, monocrystalline substrates or silicon wafers. The first substrate S1 and the second substrate S2 may include a semiconductor element, e.g., germanium (Ge), or a compound semiconductor such as silicon carbide (SiC), gallium arsenide (GaAs), indium arsenide (InAs), or indium phosphide (InP).

The first semiconductor structure 50 may include a first insulating layer 51 and a first conductive pattern 53, and the second semiconductor structure 60 may include a second insulating layer 61 and a second conductive pattern 63. The first insulating layer 51 and the second insulating layer 61 may include, for example, silicon oxide. The first conductive pattern 53 and the second conductive pattern 63 may include, for example, copper (Cu).

In an example embodiment, each of the first and second semiconductor structures 50 and 60 may include a semiconductor device layer, which includes a plurality of individual devices, and a wiring structure layer, which electrically connects the individual devices to each other.

The individual devices may include volatile memory and/or non-volatile memory. The volatile memory may include dynamic RAM (DRAM), static RAM (SRAM), and so on. The non-volatile memory may include flash memory, magnetic RAM (MRAM), a phase-change RAM (PRAM), and so on. The first substrate S1 and the second substrate S2 may include a logic chip, a system-on-chip (SoC), an ASIC, an image sensor chip, and so on. The wiring structure layer may include a metal wiring layer and/or a via plug. For example, the wiring structure layer may have a multilayer structure, in which at least two metal wiring layers and/or at least two via plugs are alternately stacked.

In example embodiments, the first substrate S1 may be a wafer including a logic chip, and the second substrate S2 may be a wafer including a memory chip. Alternatively, the first substrate S1 may be a wafer including a logic chip, and the second substrate S2 may be a wafer including an image sensor chip.

Referring to FIGS. 19 and 20, the method S2000 may include bonding the second substrate S2 to the first substrate S1 in operation S520.

In an example embodiment, the first bonding chuck 100a (in FIG. 1) and the second bonding chuck 200 (in FIG. 1) may perform align bonding to bond the first substrate S1 and the second substrate S2 to each other. For example, the first and second bonding chucks 100a and 200 may perform alignment of the first and second substrates S1 and S2 while bonding the first and second substrates S1 and S2. When the first substrate S1 is bonded to the second substrate S2, a surface 55 (in FIG. 20) of the first semiconductor structure 50 may be in contact with a surface 65 (in FIG. 20) of the second semiconductor structure 60, and the first conductive pattern 53 of the first semiconductor structure 50 may be in contact with the second conductive pattern 63 of the second semiconductor structure 60.

In an example embodiment, when the first substrate S1 is bonded to the second substrate S2 in operation S520, the process gas G1 may be injected between the first substrate S1 and the second substrate S2. For example, the process gas G1 may be injected in a direction substantially parallel with the first bonding surface of the first substrate S1 and the second bonding surface of the second substrate S2 and in a direction from the edge portions of the first and second substrates S1 and S2 toward the central portions thereof.

In an example embodiment, when the first substrate S1 is bonded to the second substrate S2 in operation S520, the air curtain forming gas G2 may be injected to form an air curtain surrounding the edges of the first and second substrates S1 and S2. For example, the air curtain forming gas G2 may be injected in a direction substantially perpendicular to the first bonding surface of the first substrate S1 and the second bonding surface of the second substrate S2. The injection direction of the air curtain forming gas G2 may be substantially perpendicular to the injection direction of the process gas G1.

Referring to FIGS. 19 and 21, the method S2000 may include annealing the first substrate S1 and the second substrate S2, which are bonded to each other, in operation S530 to enhance bonding strength between the first substrate S1 and the second substrate S2.

Due to the annealing, the first conductive pattern 53 of the first semiconductor structure 50 may be strongly bonded to the second conductive pattern 63 of the second semiconductor structure 60, and the first insulating layer 51 of the first semiconductor structure 50 may also be strongly bonded to the second insulating layer 61 of the second semiconductor structure 60.

The method S2000 may include performing subsequent semiconductor processes on a bonded substrate 70, which results from bonding the first substrate S1 to the second substrate S2, in operation S540. For example, subsequent steps of manufacturing the semiconductor device may be performed on the bonded substrate 70.

In an example embodiment, the subsequent semiconductor processes may include various processes such as a vapor deposition process, an etching process, an ion process, and a cleaning process. For example, the vapor deposition process may include various material layer forming processes such as chemical vapor deposition (CVD), sputtering, and spin coating. The ion process may include ion-implantation, diffusion, and heat treatment.

Integrated circuits and wirings, which form semiconductor devices, may be formed by performing the subsequent semiconductor processes. The subsequent semiconductor processes may also include a packaging process of mounting a semiconductor device on a printed circuit substrate and forming a molding layer. The subsequent semiconductor processes may also include a process of testing a semiconductor device or a semiconductor package. A semiconductor device or a semiconductor package may be completed by performing the subsequent semiconductor processes.

The method S2000 may include injecting the process gas G1 when the first substrate S1 is bonded to the second substrate S2 in operation S520. Accordingly, when the first substrate S1 is bonded to the second substrate S2, a pressure may be prevented from rapidly dropping near the outer regions of the first and second substrates S1 and S2, and occurrence of a void may be suppressed because vapor is not condensed between the first and second substrates S1 and S2.

The method S2000 may include forming an air curtain by injecting the air curtain forming gas G2 when the first substrate S1 is bonded to the second substrate S2 in operation S520. Accordingly, a change in the atmosphere of a process space defined by the air curtain may be decreased. Therefore, the bonding alignment between the first and second substrates S1 and S2 may be improved.

While the inventive concept has been particularly shown and described with reference to embodiments thereof, it will be understood that various changes in form and details may be made therein without departing from the spirit and scope of the following claims.

What is claimed is:

1. A bonding method for bonding a first substrate to a second substrate, the bonding method comprising:
    fixing the first substrate to a first surface of a first bonding chuck and fixing the second substrate to a second surface of a second bonding chuck, the second surface facing the first surface;
    aligning the second bonding chuck with the first bonding chuck;
    injecting a process gas in a space between the first substrate fixed to the first bonding chuck and the second substrate fixed to the second bonding chuck using a process gas injector surrounding the first surface of the first bonding chuck while injecting an air curtain forming gas to form an air curtain surrounding the first substrate and the second substrate using an air curtain generator; and
    causing the first substrate fixed to the first bonding chuck to contact the second substrate fixed to the second bonding chuck to make a bonded substrate.

2. The bonding method of claim 1, further comprising, before the aligning the second bonding chuck with the first bonding chuck, injecting the process gas between the first substrate and the second substrate and injecting the air curtain forming gas to form the air curtain.

3. The bonding method of claim 1, further comprising, before causing the first substrate to contact the second substrate, injecting the process gas between the first substrate and the second substrate and injecting the air curtain forming gas to form the air curtain.

4. The bonding method of claim 1, wherein, in the aligning the second bonding chuck with the first bonding chuck, the first surface of the first substrate is separated from the second surface of the second substrate from 50 micrometers to 200 micrometers.

5. The bonding method of claim 1, wherein, injecting the process gas and injecting the air curtain forming gas are performed while aligning the second bonding chuck with the first bonding chuck.

6. The bonding method of claim 1, wherein causing the first substrate fixed to the first bonding chuck to contact the second substrate fixed to the second bonding chuck to make a bonded substrate comprises:
 contacting the first substrate and the second substrate with each other at a contact point;
 propagating a bonding area between the first substrate and the second substrate; and
 bonding an outer region of the second substrate to an outer region of the first substrate.

7. The bonding method of claim 6, wherein, injecting the process gas and injecting the air curtain forming gas are performed before the propagating the bonding area between the first substrate and the second substrate.

8. The bonding method of claim 6, further comprising controlling an injection angle of the process gas of the process gas injector based on a change in a tilt angle of an edge portion of the second substrate performed while propagating the bonding area between the first substrate and the second substrate.

9. The bonding method of claim 1, further comprising:
 stopping injection of the process gas and the air curtain forming gas; and
 unloading the bonded substrate from the first bonding chuck.

10. A bonding method for bonding a first substrate to a second substrate, the bonding method comprising:
 fixing the first substrate to a first surface of a first bonding chuck and fixing the second substrate to a second surface of a second bonding chuck, the second surface facing the first surface;
 injecting a process gas between the first substrate fixed to the first bonding chuck and the second substrate fixed to the second bonding chuck using a process gas injector surrounding the first bonding chuck and injecting an air curtain forming gas to form an air curtain surrounding the first substrate fixed to the first bonding chuck and the second substrate fixed to the second bonding chuck using an air curtain generator surrounding the process gas injector in a plan view;
 aligning the second bonding chuck with the first bonding chuck; and
 bonding the first substrate fixed to the first bonding chuck to the second substrate fixed to the second bonding chuck to make a bonded substrate,
 wherein a controller controls at least one parameter selected from a kind of process gas, a flow rate of the process gas, a temperature of the process gas, a pressure of the process gas, and a speed of the process gas.

11. The bonding method of claim 10, further comprising controlling an injection angle of the process gas by the controller according to a change in a curvature of at least one substrate selected from the first substrate and the second substrate using an injection angle adjuster performed while bonding the first substrate to the second substrate.

12. The bonding method of claim 10, wherein, in the injecting the process gas, the process gas injector injects the process gas in a first direction from an edge portion toward a central portion of the first substrate fixed on the first surface of the first bonding chuck, and
 the air curtain generator is configured to inject the air curtain forming gas in a direction perpendicular to the first direction.

13. The bonding method of claim 10, wherein, in the injecting the process gas, the process gas injector injects the process gas in a first direction parallel with the first surface of the first bonding chuck, and
 the air curtain generator is configured to inject the air curtain forming gas in a second direction perpendicular to the first direction.

14. The bonding method of claim 10, wherein, the process gas is non-reactive to the first substrate and the second substrate.

15. The bonding method of claim 10, wherein, the air curtain generator injects the air curtain forming gas to form the air curtain to surround side portions of the first bonding chuck, the second bonding chuck, and the process gas injector.

16. The bonding method of claim 10, wherein, the air curtain forming gas includes nitrogen or clean dry air.

17. The bonding method of claim 10, wherein, the process gas injector has a ring shape surrounding the first substrate and the second substrate, and the air curtain generator has a ring shape surrounding the first substrate and the second substrate.

18. The bonding method of claim 10, wherein injecting the process gas and injecting the air curtain forming gas are performed while aligning the second bonding chuck and the first bonding chuck.

19. A method for manufacturing a semiconductor device, the method comprising:
 providing a first substrate including a first insulating layer and a first conductive pattern on a surface of the first substrate, and a second substrate including a second insulating layer and a second conductive pattern on a surface of the second substrate;
 fixing the first substrate to a first surface of a first bonding chuck and fixing the second substrate to a second surface a second bonding chuck, the second surface facing the first surface;
 aligning the second bonding chuck with the first bonding chuck;
 injecting a process gas in a space between the first substrate fixed to the first bonding chuck and the second substrate fixed to the second bonding chuck using a process gas injector while injecting an air curtain forming gas to form an air curtain surrounding the first substrate and the second substrate using an air curtain generator surrounding the process gas injector in a plan view;
 bonding the first substrate to the second substrate, wherein the first conductive pattern contacts the second conductive pattern to make a bonded substrate;
 annealing the bonded substrate; and
 performing subsequent semiconductor processes on the bonded substrate.

20. The method of claim 19, wherein the air curtain generator is configured to inject the air curtain forming gas in a direction perpendicular to a direction of injecting the process gas.

* * * * *